US010916495B2

(12) United States Patent
Choi et al.

(10) Patent No.: US 10,916,495 B2
(45) Date of Patent: Feb. 9, 2021

(54) FAN-OUT SEMICONDUCTOR PACKAGE

(71) Applicant: SAMSUNG ELECTRONICS CO., LTD., Suwon-si (KR)

(72) Inventors: Ik Jun Choi, Suwon-si (KR); Jae Ean Lee, Suwon-si (KR); Kwang Ok Jeong, Suwon-si (KR); Young Gwan Ko, Suwon-si (KR); Jung Soo Byun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 15/935,526

(22) Filed: Mar. 26, 2018

(65) Prior Publication Data

US 2019/0131224 A1 May 2, 2019

(30) Foreign Application Priority Data

Oct. 26, 2017 (KR) .................. 10-2017-0139983

(51) Int. Cl.
*H01L 23/498* (2006.01)
*H01L 23/31* (2006.01)
(Continued)

(52) U.S. Cl.
CPC ...... *H01L 23/49822* (2013.01); *H01L 21/486* (2013.01); *H01L 21/4857* (2013.01);
(Continued)

(58) Field of Classification Search
CPC ..................... H01L 23/49822; H01L 21/4857
See application file for complete search history.

(56) References Cited

U.S. PATENT DOCUMENTS

| 7,297,562 B1 | 11/2007 | Huemoeller et al. |
| 2002/0117743 A1 | 8/2002 | Nakatani et al. |

(Continued)

FOREIGN PATENT DOCUMENTS

| CN | 102056407 A | 5/2011 |
| CN | 102969252 A | 3/2013 |

(Continued)

OTHER PUBLICATIONS

Notice of Reason for Rejection issued in Korean Patent Application No. 10-2017-0139983, dated Apr. 27, 2018 (English translation).

(Continued)

*Primary Examiner* — Walter H Swanson
(74) *Attorney, Agent, or Firm* — Sughrue Mion, PLLC

(57) ABSTRACT

A semiconductor package includes a supporting member that has a cavity and includes a wiring structure connecting first and second surfaces opposing each other. A connection member is on the second surface of the supporting member and includes a first redistribution layer connected to the wiring structure. A semiconductor chip is on the connection member in the cavity and has connection pads connected to the first redistribution layer. An encapsulant encapsulates the semiconductor chip disposed in the cavity and covers the first surface of the supporting member. A second redistribution layer includes wiring patterns embedded in the encapsulant and has exposed surfaces and connection vias that penetrate through the encapsulant to connect the wiring structure and the wiring patterns to each other.

16 Claims, 36 Drawing Sheets

(51) Int. Cl.
  *H01L 23/528* (2006.01)
  *H01L 21/48* (2006.01)
  *H01L 23/522* (2006.01)
  *H01L 21/56* (2006.01)
  *H01L 23/00* (2006.01)

(52) U.S. Cl.
  CPC ........ *H01L 21/568* (2013.01); *H01L 23/3128* (2013.01); *H01L 23/49827* (2013.01); *H01L 23/528* (2013.01); *H01L 23/5226* (2013.01); *H01L 24/18* (2013.01); *H01L 2224/16225* (2013.01); *H01L 2224/18* (2013.01); *H01L 2224/32225* (2013.01); *H01L 2224/73204* (2013.01); *H01L 2924/15311* (2013.01); *H01L 2924/181* (2013.01)

(56) References Cited

U.S. PATENT DOCUMENTS

| | | |
|---|---|---|
| 2006/0040463 A1 | 2/2006 | Sunohara |
| 2006/0134907 A1 | 6/2006 | Ikeda |
| 2010/0078213 A1 | 4/2010 | Furutani et al. |
| 2011/0100689 A1 | 5/2011 | Byun et al. |
| 2012/0013021 A1 | 1/2012 | Kobayashi et al. |
| 2013/0049182 A1 | 2/2013 | Gong et al. |
| 2016/0338202 A1 | 11/2016 | Park et al. |
| 2016/0343695 A1 | 11/2016 | Lin et al. |
| 2017/0103951 A1 | 4/2017 | Lee et al. |

FOREIGN PATENT DOCUMENTS

| | | |
|---|---|---|
| JP | 2000-349437 | 12/2000 |
| JP | 2002-261449 A | 9/2002 |
| JP | 2006-59992 A | 3/2006 |
| JP | 2012-39090 A | 2/2012 |
| JP | 2017-76790 A | 4/2017 |
| KR | 10-2011-0017912 A | 2/2011 |
| KR | 10-2011-0037169 A | 4/2011 |
| KR | 10-2017-0043427 A | 4/2017 |
| TW | 201642406 A | 12/2016 |
| TW | 201709777 A | 3/2017 |
| WO | 2005/004567 A1 | 1/2005 |

OTHER PUBLICATIONS

Communication dated May 28, 2019, issued by the Japanese Patent Office in counterpart Japanese Application No. 2018-060678.
Taiwanese Office Action dated Nov. 9, 2018 issued in Taiwanese Patent Application No. 107110171 (with English translation).

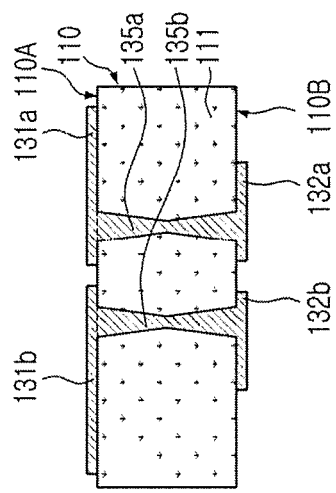
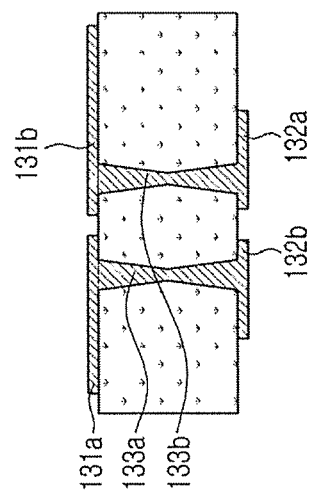
FIG. 12B

II-II'

II-II'

II-II'

II-II'

FAN-OUT SEMICONDUCTOR PACKAGE

CROSS-REFERENCE TO RELATED APPLICATION(S)

This application claims benefit of priority to Korean Patent Application No. 10-2017-0139983 filed on Oct. 26, 2017 in the Korean Intellectual Property Office, the disclosure of which is incorporated herein by reference in its entirety.

BACKGROUND

1. Field

The present disclosure relates to a fan-out semiconductor package.

2. Description of Related Art

Semiconductor packages have been continuously required to be made thinner and lighter, and have needed to be implemented in a system in package (SiP) form that requires complexity and multifunctionality. In accordance with such a development trend, a fan-out wafer level package (FOWLP) has recently been prominent, and attempts to satisfy requirements of semiconductor packaging by applying several techniques to such a FOWLP have been conducted.

For example, in a specific package such as a wireless fidelity (Wi-Fi) module, a rear redistribution layer (RDL) may be required in order to be utilized as a heat dissipation pad while being matched to pins of a set. However, such a rear redistribution layer requires a separate line process for additional lithography.

SUMMARY

An aspect of the present disclosure may provide a fan-out semiconductor package having a redistribution layer capable of being implemented by a simplified process.

According to an aspect of the present disclosure, a semiconductor package is implemented by laminating a redistribution layer prepared in advance on a surface of an encapsulant.

According to an aspect of the present disclosure, a semiconductor package may include a supporting member that has a cavity and includes a wiring structure connecting first and second surfaces opposing each other. A connection member is on the second surface of the supporting member and includes a first redistribution layer connected to the wiring structure. A semiconductor chip is on the connection member in the cavity and has connection pads connected to the first redistribution layer. An encapsulant encapsulates the semiconductor chip disposed in the cavity and covers the first surface of the supporting member. A second redistribution layer includes wiring patterns embedded in the encapsulant and has exposed surfaces and connection vias that penetrate through the encapsulant to connect the wiring structure and the wiring patterns to each other.

According to another aspect of the present disclosure, a semiconductor package may include a supporting member that has a cavity and includes a wiring structure connecting first and second surfaces opposing each other. A connection member is on the second surface of the supporting member and includes a first redistribution layer connected to the wiring structure. A semiconductor chip is on the connection member in the cavity and has connection pads connected to the first redistribution layer. An encapsulant encapsulates the semiconductor chip in the cavity and covers the first surface of the supporting member. A second redistribution layer includes an insulating layer with first and second surfaces opposing each other. First wiring patterns are embedded in the first surface of the insulating layer and second wiring patterns are on the second surface of the insulating layer and embedded in the encapsulant. Connection vias penetrate through the insulating layer and the encapsulant to connect at least one of the first and second wiring patterns and the wiring structure to each other, with the second surface being in contact with the encapsulant.

BRIEF DESCRIPTION OF DRAWINGS

The above and other aspects, features, and advantages of the present disclosure will be more clearly understood from the following detailed desdription taken in conjunction with the accompanying drawings, in which:

FIGS. 12A through 12H are cross-sectional views illustrating a process of forming a first redistribution layer and a lamination process of a method of manufacturing the fan-out semiconductor package illustrated in FIG. 9;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used to describe exemplary embodiments and do not necessarily limit the present disclosure. In this case, singular forms include plural forms unless interpreted otherwise in context.

Electronic Device

Figure 1:
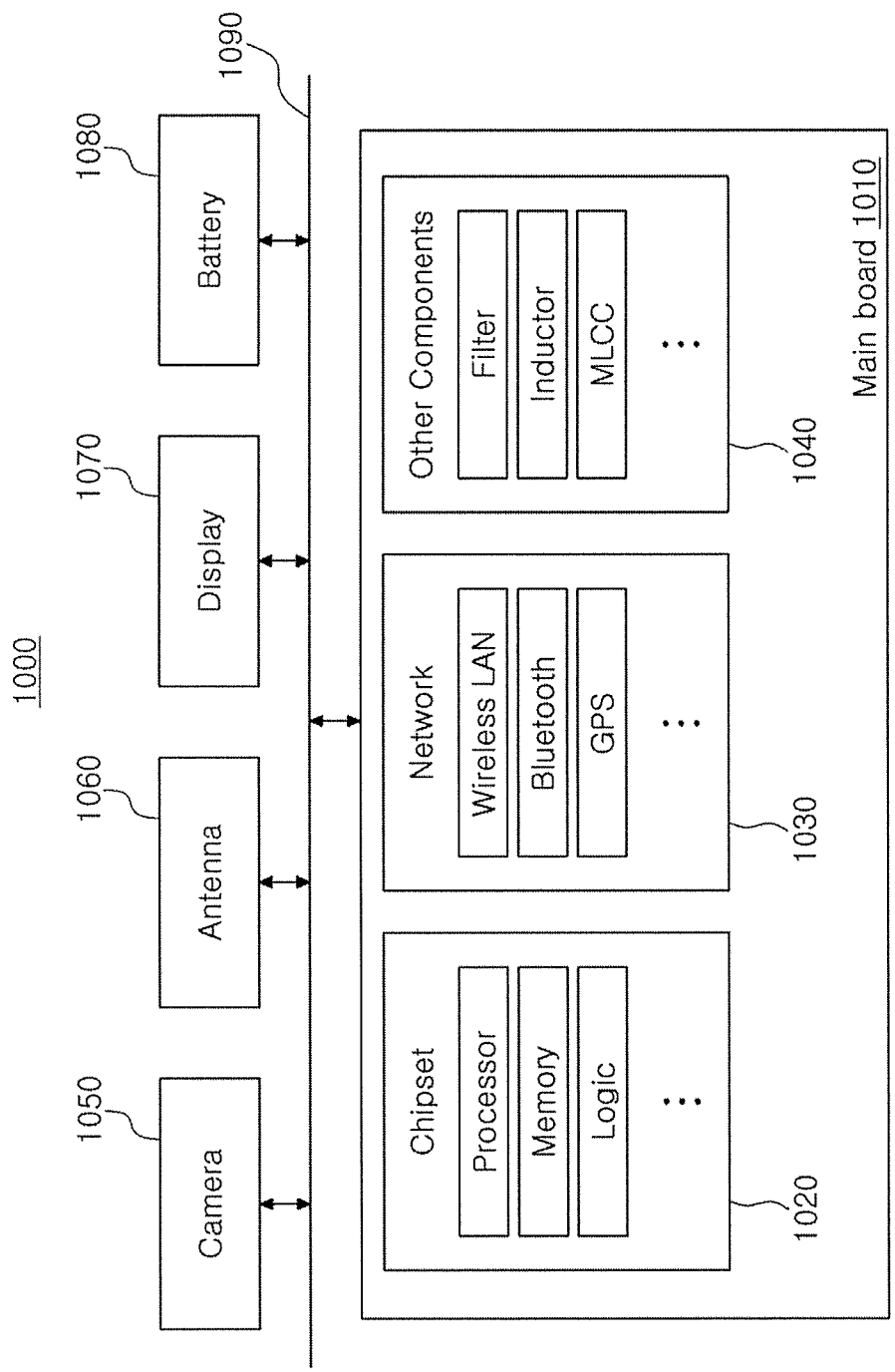
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to other components, to be described below, to form various signal lines 1090.

The chip related components 1020 may include a memory chip, such as a volatile memory (for example, a dynamic random access memory (DRAM)), a non-volatile memory (for example, a read only memory (ROM)), a flash memory, or the like. The chip related components 1020 may also include an application processor chip such as a central processor (for example, a central processing unit (CPU)), a graphics processor (for example, a graphics processing unit (GPU)), a digital signal processor, a cryptographic processor, a microprocessor, a microcontroller, or the like. The chip related components 1020 may additionally include a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, or other components not illustrated, including an audio codec, a video codec), a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
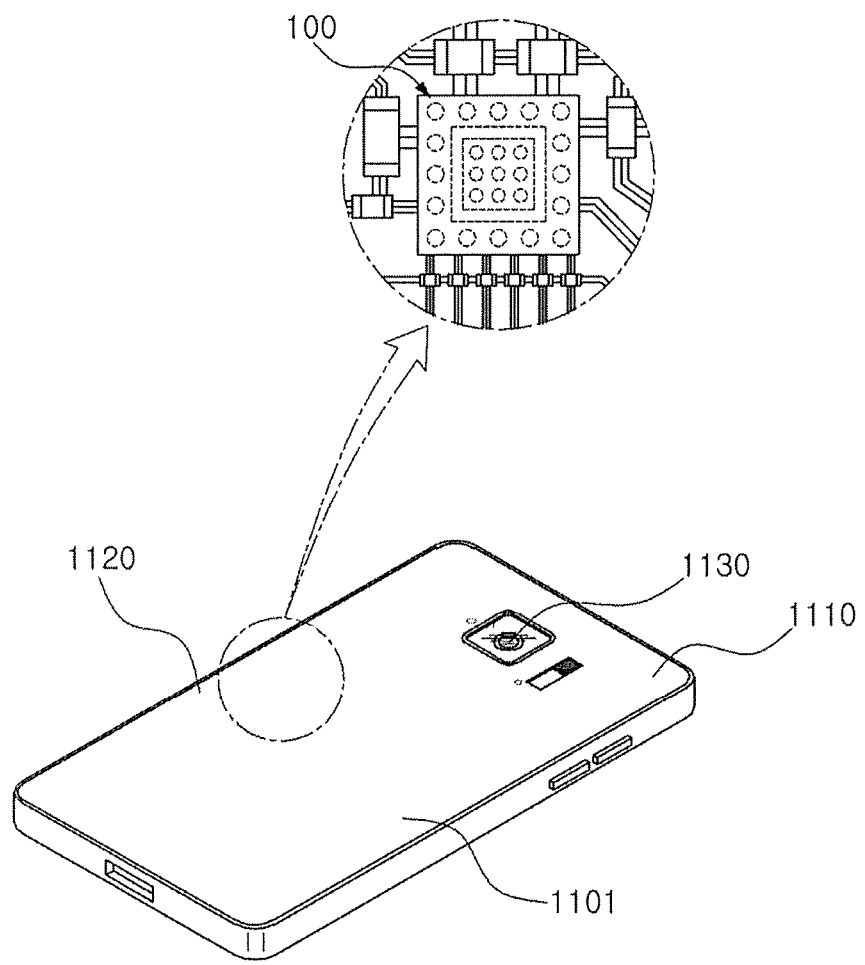
FIG. 2 is a schematic perspective view illustrating an example of an electronic device.

FIG. 2 is a schematic perspective view illustrating an example of an electronic device.

Referring to FIG. 2, a semiconductor package may be used for various purposes in electronic devices 1000 as described above. For example, a motherboard 1110 may be accommodated in a body 1101 of a smartphone 1100, and various electronic components 1120 may be physically or electrically connected to the motherboard 1110. Other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may be damaged due to external physical or chemical impacts and may not serve as a semiconductor finished product in oneself. Rather, the semiconductor chip is packaged and is used in an electronic device, or the like, in a package state.

The reason why semiconductor packaging is required is that there is a difference in a circuit width between the semiconductor chip and a main board of the electronic device in terms of electrical connection. The size of connection pads of the semiconductor chip and the interval between the connection pads of the semiconductor chip are very fine, whereas the size of component mounting pads of the main board used in the electronic device and the interval between the component mounting pads of the main board are significantly larger than those of the semiconductor chip. Therefore, it may be difficult to directly mount the semiconductor chip on the main board, and packaging technology may be required for buffering the difference in circuit width between the semiconductor and the main board.

A semiconductor package manufactured by the packaging technology may be classified as a fan-in semiconductor package or a fan-out semiconductor package depending on its structure and purpose.

The fan-in semiconductor package and the fan-out semiconductor package will hereinafter be described in more detail with reference to the drawings.

Fan-In Semiconductor Package

Figure 3:
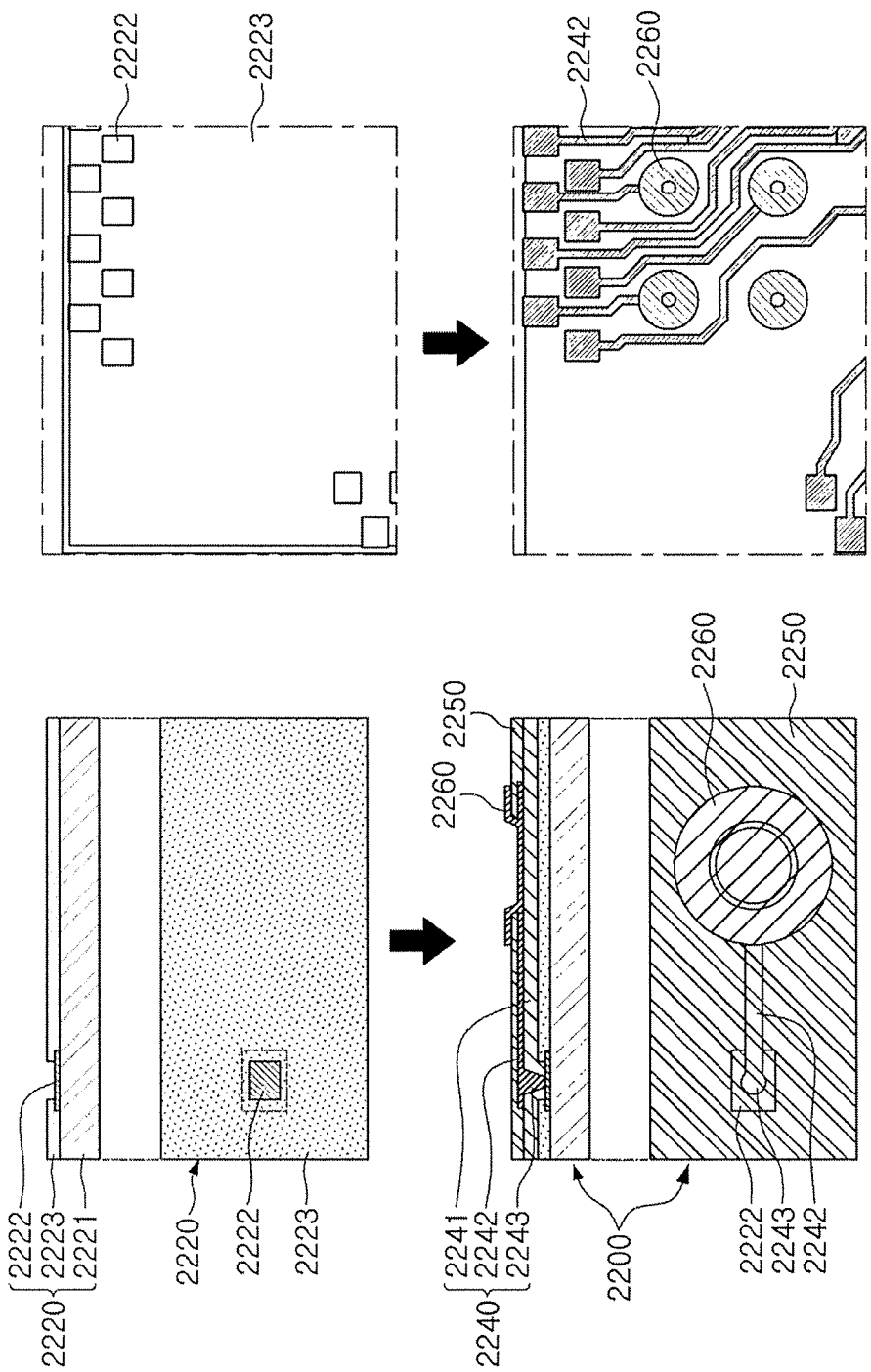
FIGS. 3A and 3B are schematic cross-sectional views illustrating states of a fan-in semiconductor package before and after being packaged.
Figure 4:
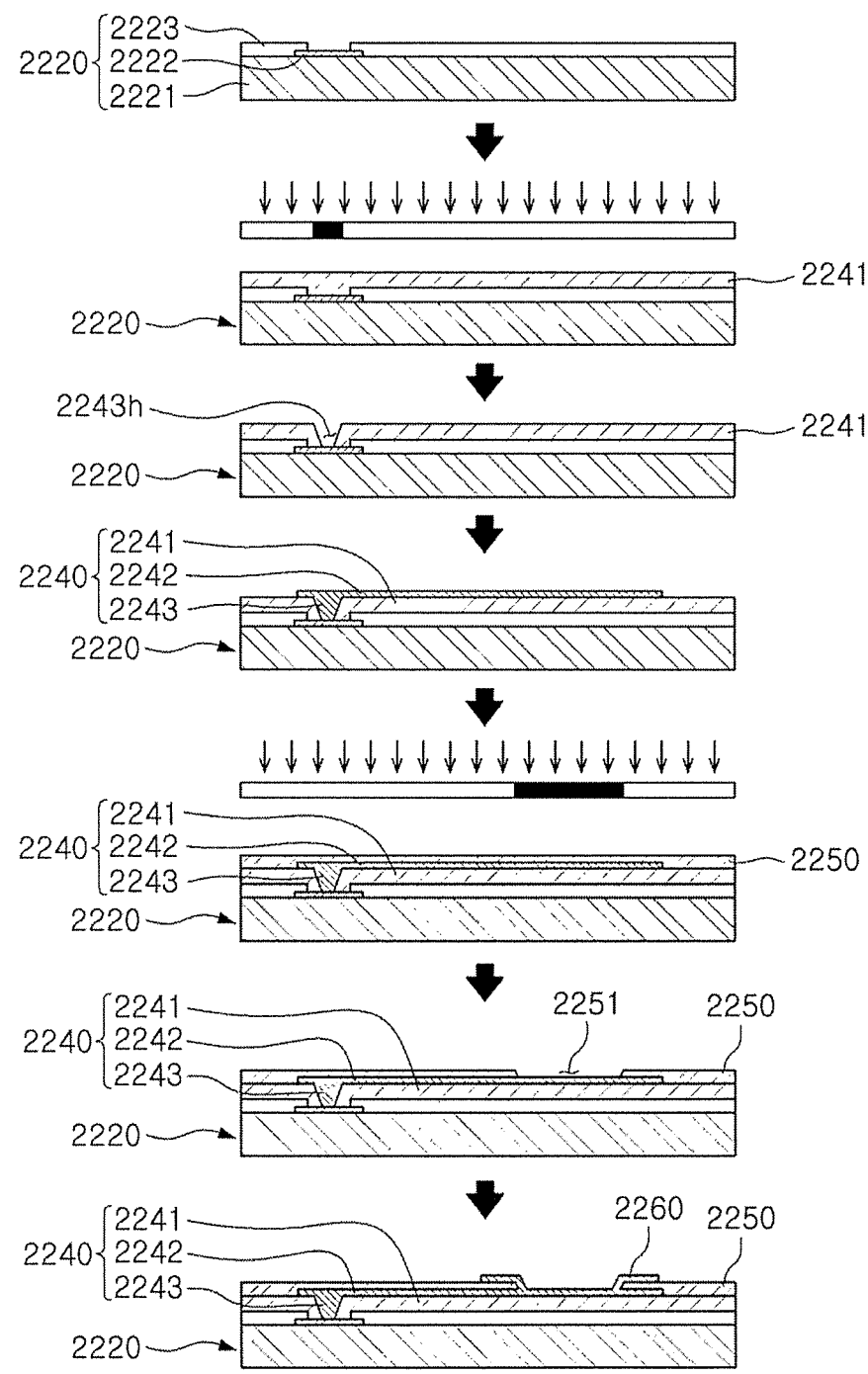
FIG. 4 is schematic cross-sectional views illustrating a packaging process of a fan-in semiconductor package.

FIGS. 3A and 3B are schematic cross-sectional views illustrating states of a fan-in semiconductor package before and after being packaged. FIG. 4 includes schematic cross-sectional views illustrating a packaging process of a fan-in semiconductor package.

Referring to the drawings, a semiconductor chip 2220 may be, for example, an integrated circuit (IC) in a bare state, including a body 2221, including silicon (Si), germanium (Ge), gallium arsenide (GaAs), or the like, connection pads 2222 formed on one surface of the body 2221, including a conductive material such as aluminum (Al), or the like, and a passivation layer 2223, such as an oxide film, a nitride film, or the like, formed on one surface of the body 2221 and covering at least portions of the connection pads 2222. Since the connection pads 2222 are significantly small, it may be difficult to mount the integrated circuit (IC) on an intermediate level printed circuit board (PCB) as well as on the main board of the electronic device, or the like.

Therefore, depending on the size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening to the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. A fan-in semiconductor package 2200 including, for example, the semiconductor chip 2220, the connection member 2240, the passivation layer 2250, and the underbump metal layer 2260 may thus be manufactured through a series of steps.

As described above, the fan-in semiconductor package may have a package form in which all of the connection pads, for example, input/output (I/O) terminals, of the semiconductor chip are disposed inside the semiconductor chip, may have excellent electrical characteristics and be produced at a low cost. As a result, many elements mounted in smartphones have been manufactured in a fan-in semiconductor package form and developed to implement a rapid signal transfer while having a compact size.

However, since all I/O terminals need to be disposed inside the semiconductor chip in the fan-in semiconductor package, the fan-in semiconductor package has a large spatial limitation. It may be difficult to apply this structure to a semiconductor chip having a large number of I/O terminals or a semiconductor chip having a small size. In addition, due to the disadvantages described above, the fan-in semiconductor package may not be directly mounted and used on the main board of the electronic device. The reason is that even when the size of the I/O terminals of the semiconductor chip and the interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
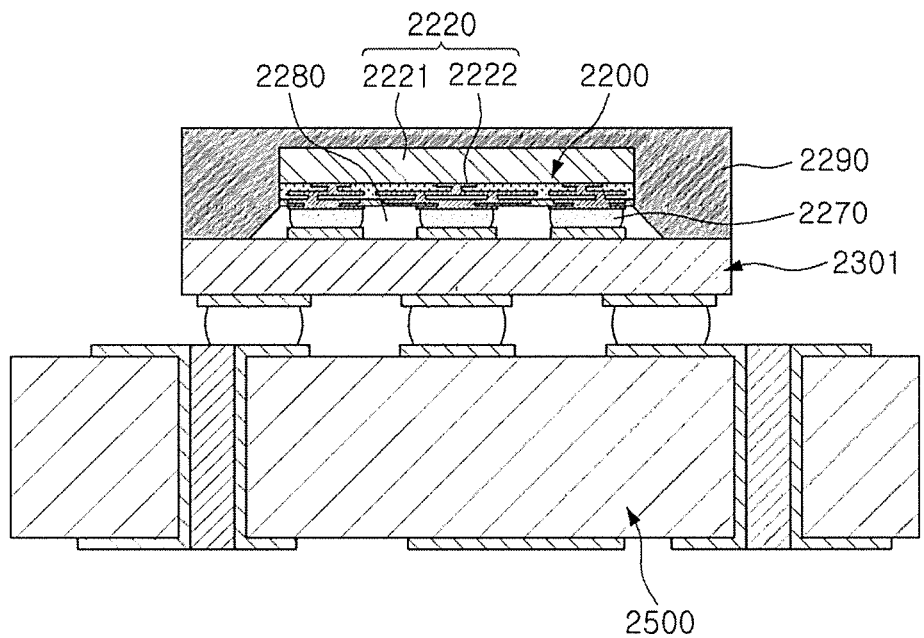
FIG. 5 is a schematic cross-sectional view illustrating a case in which a fan-in semiconductor package is mounted on an interposer substrate and is ultimately mounted on a main board of an electronic device.
Figure 6:
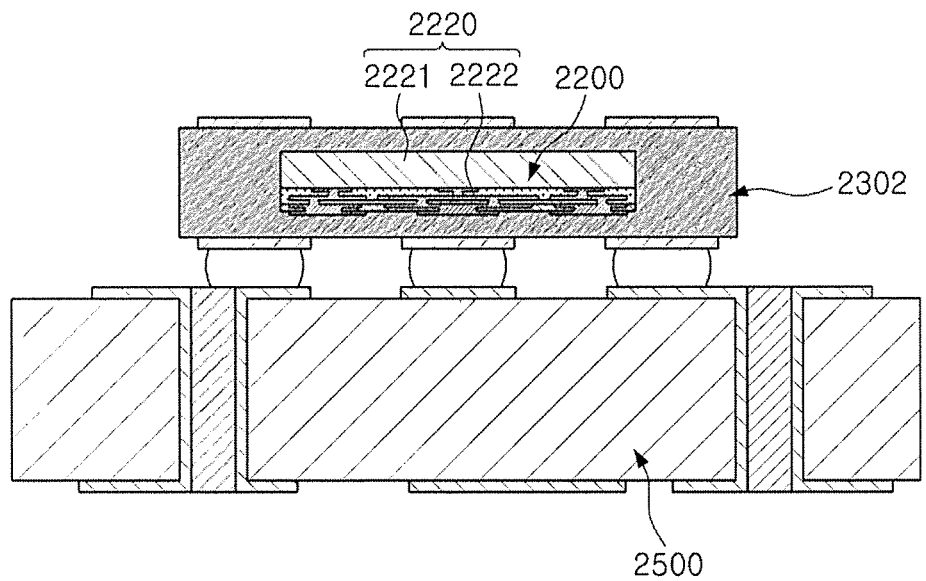
FIG. 6 is a schematic cross-sectional view illustrating a case in which a fan-in semiconductor package is embedded in an interposer substrate and is ultimately mounted on a main board of an electronic device.

FIG. 5 is a schematic cross-sectional view illustrating a fan-in semiconductor package mounted on an interposer substrate and ultimately mounted on a main board of an electronic device. FIG. 6 is a schematic cross-sectional view illustrating a fan-in semiconductor package embedded in an interposer substrate and ultimately mounted on a main board of an electronic device.

Referring to the drawings, in a fan-in semiconductor package 2200, connection pads 2222, that is, I/O terminals, of the semiconductor chip 2220 may be redistributed once more through an interposer substrate 2301. The fan-in semiconductor package 2200 may be ultimately mounted on a main board 2500 of an electronic device where it is mounted on the interposer substrate 2301. Solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302. Connection pads 2222, that is, I/O terminals, of the semiconductor chip 2220 may be redistributed once more by the interposer substrate 2302 where the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device where it is embedded in the interposer substrate.

Fan-Out Semiconductor Package

Figure 7:
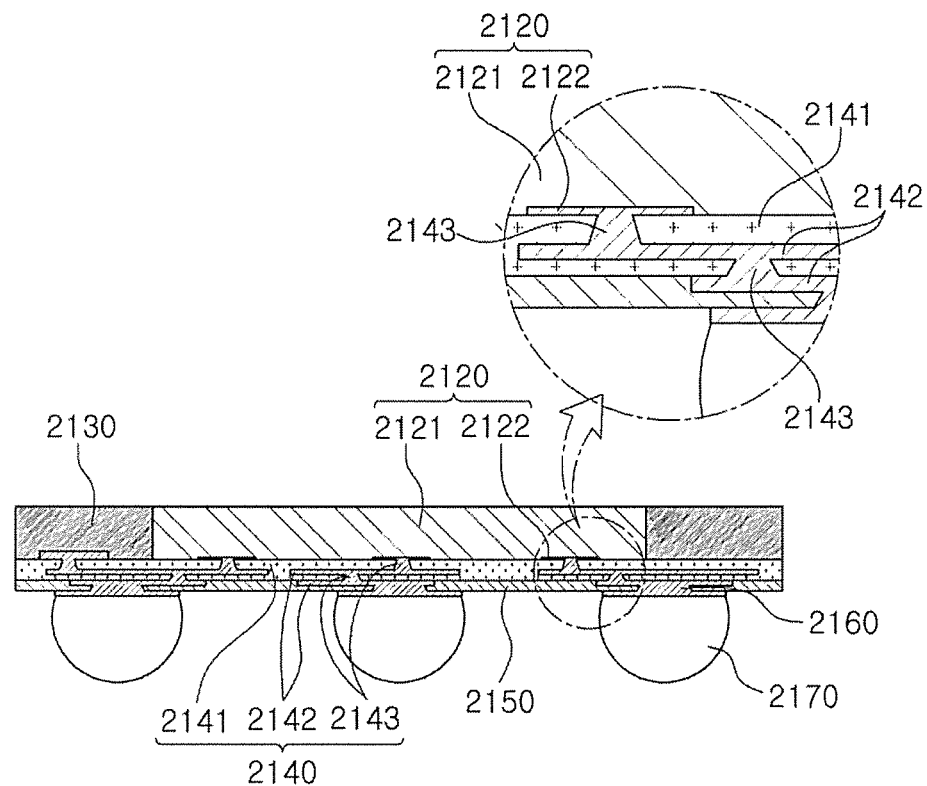
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width reduced toward the semiconductor chip (see an enlarged region).

The fan-out semiconductor package may have a form in which I/O terminals of the semiconductor chip are redistributed and disposed outwardly of the semiconductor chip through the connection member formed on the semiconductor chip. In the fan-in semiconductor package, all I/O terminals of the semiconductor chip need to be disposed inside the semiconductor chip. Therefore, when the size of the semiconductor chip is decreased, the size and pitch of the balls need to be decreased, such that a standardized ball layout may not be used in the fan-in semiconductor package. On the other hand, the fan-out semiconductor package has a form in which the I/O terminals of the semiconductor chip are redistributed and disposed outwardly of the semiconductor chip through the connection member formed on the semiconductor chip as described above. Therefore, even where the size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
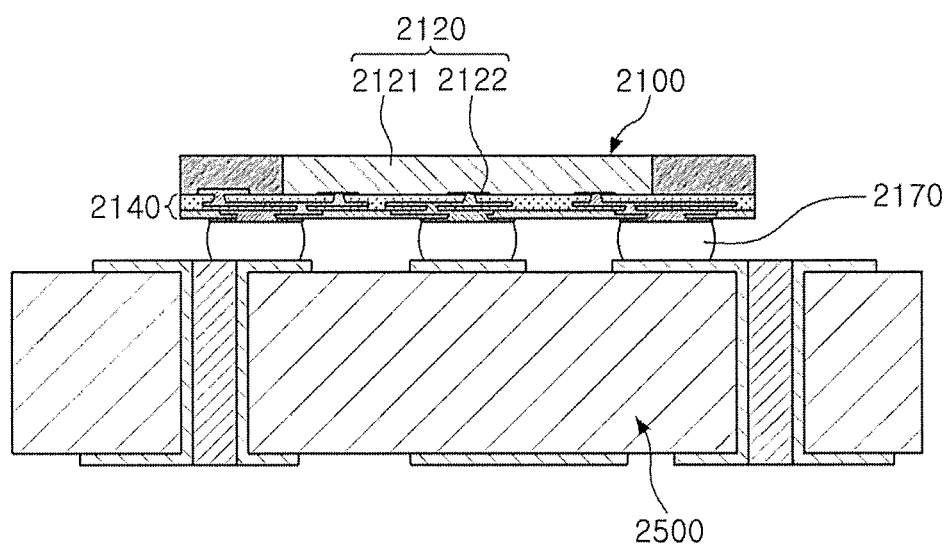
FIG. 8 is a schematic cross-sectional view illustrating a case in which a fan-out semiconductor package is mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. As described above, the fan-out semiconductor package 2100 includes the connection member 2140 formed on the semiconductor chip 2120 and capable of redistributing the connection pads 2122 to a fan-out region that is outside of an area of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

Since the fan-out semiconductor package may be mounted on the main board of the electronic device without using the separate interposer substrate, the fan-out semiconductor package may be implemented at a smaller thickness than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package having a redistribution layer embedded in a surface of an encapsulant will hereinafter be described in detail with reference to the accompanying drawings.

Figure 9:
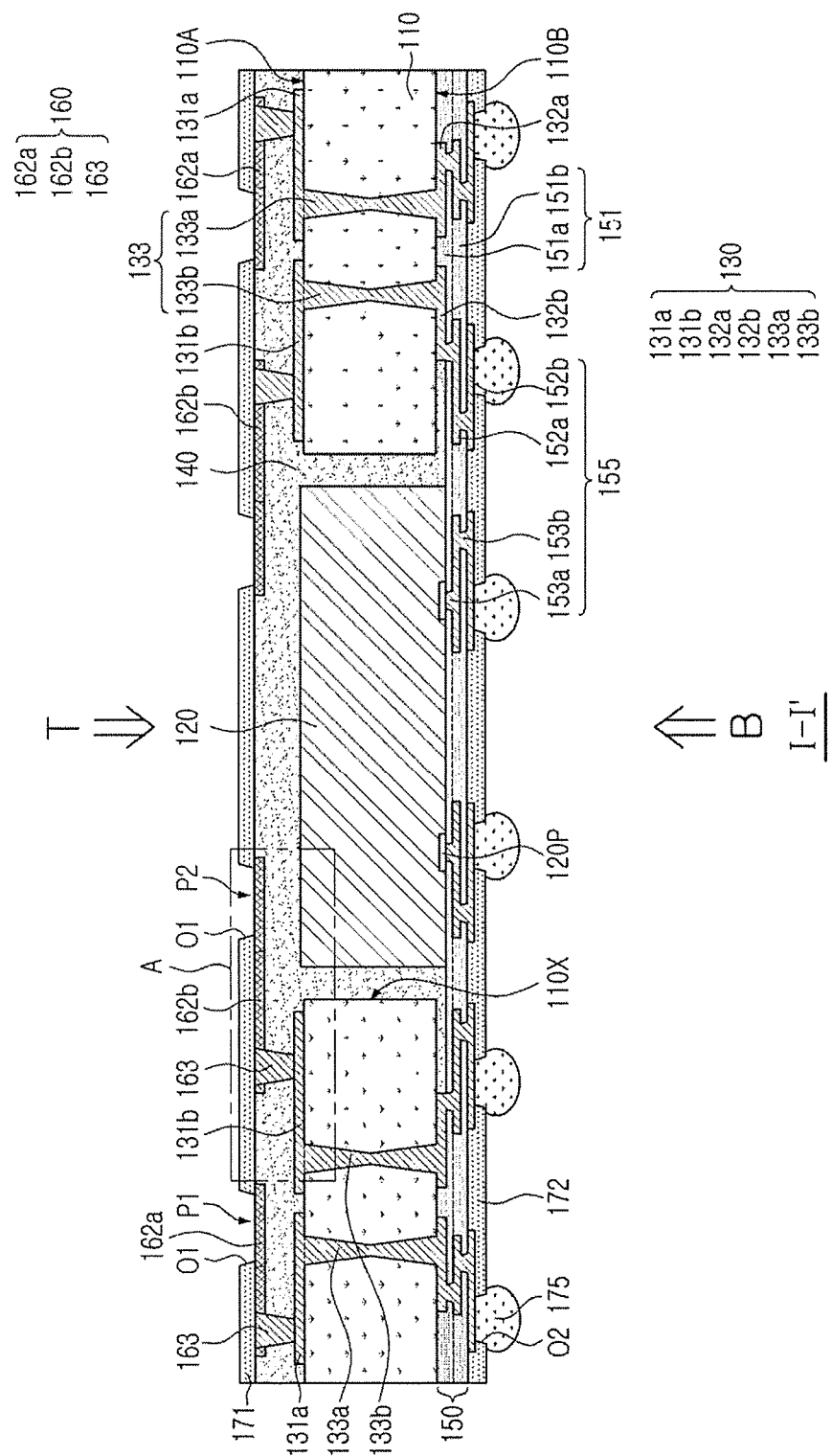
FIG. 9 is a side cross-sectional view illustrating a fan-out semiconductor package according to an exemplary embodiment in the present disclosure.
Figure 10A:
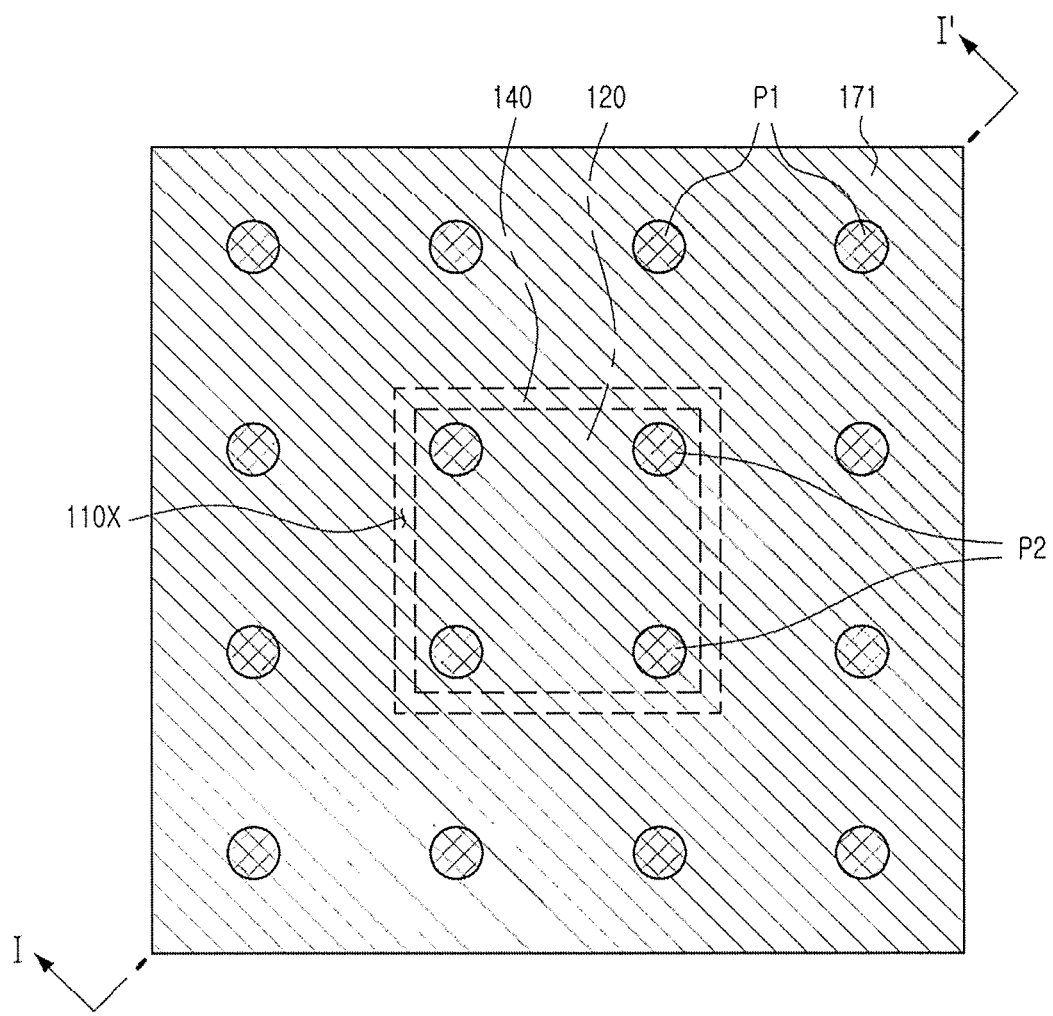
FIGS. 10A and 10B are, respectively, a plan view and a bottom view illustrating the fan-out semiconductor package illustrated in FIG. 9.
Figure 10B:
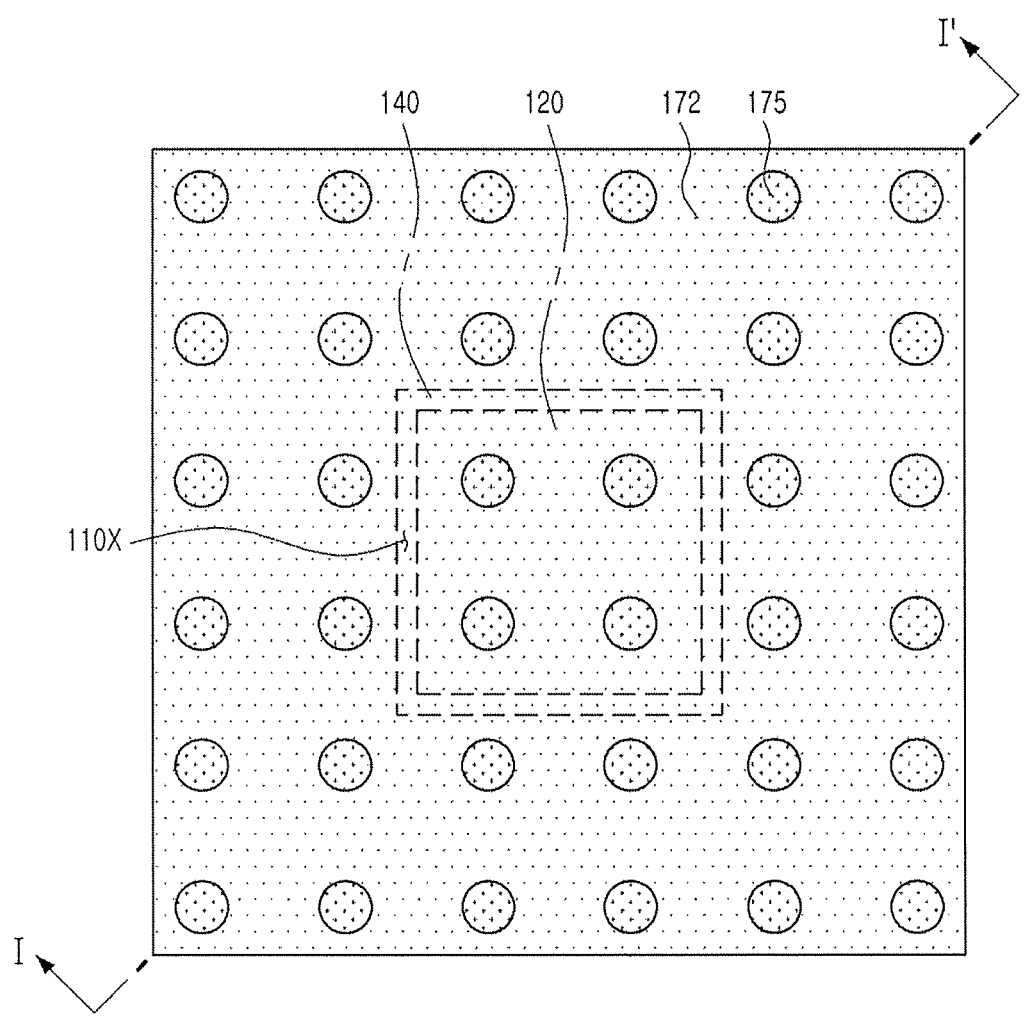

FIG. 9 is a side cross-sectional view illustrating a fan-out semiconductor package according to an exemplary embodiment in the present disclosure. FIGS. 10A and 10B are, respectively, a plan view (viewed in direction "T" of FIG. 9) and a bottom view (viewed in direction "B" of FIG. 9) illustrating the fan-out semiconductor package illustrated in FIG. 9.

Referring to FIG. 9, a fan-out semiconductor package 100 according to the present exemplary embodiment may include a supporting member 110 having a cavity 110X and first and second surfaces 110A and 110B opposing each other. A semiconductor chip 120 may be in the cavity 110X. A connection member 150 may be on the second surface 110B of the supporting member 110 and below the semiconductor chip 120. An encapsulant 140 may encapsulate the semiconductor chip 120 in the cavity 110X and cover the first surface 110A of the supporting member 110.

The supporting member 110 may include a wiring structure 130 connecting the first surface 110A and the second surface 110B to each other. In the present exemplary embodiment, the wiring structure 130 includes first and second upper patterns 131*a* and 131*b* and first and second lower patterns 132a and 132b that are, respectively, on the first surface 110A and the second surface 110B of the supporting member 110. The wiring structure 130 of the present exemplary embodiment also includes first and second through-vias 133a and 133b connecting the first and second upper patterns 131a and 131b and the first and second lower patterns 132a and 132b to each other.

The connection member 150 may include an insulating layer 151 and a first redistribution layer 155 formed on the insulating layer 151. The first redistribution layer 155 may be connected to the wiring structure 130 of the supporting member 110 and connection pads 120P of the semiconductor chip 120.

In the present exemplary embodiment, the first redistribution layer 155 includes first wiring patterns 152a on a first insulating layer 151a and second wiring patterns 152b on a second insulating layer 151b. The first wiring patterns 152a may be connected to the connection pads 120P of the semiconductor chip 120 and the first and second lower patterns 132a and 132b of the wiring structure 130 by first vias 153a formed in the first insulating layer 151a. Similarly, the second wiring patterns 152b may be connected to the first wiring patterns 152a by second vias 153b formed in the second insulating layer 151b.

The fan-out semiconductor package 100 according to the present exemplary embodiment may include a second redistribution layer 160 embedded in the encapsulant 140 so that portions of a surface of the second redistribution layer 160 are exposed. The second redistribution layer 160 may be connected to the first redistribution layer 155 through the wiring structure 130 of the supporting member 110.

In the present exemplary embodiment, the second redistribution layer 160 may include wiring patterns 162a and 162b embedded in the encapsulant 140 and each having an exposed surface. The redistribution layer 160 may include connection vias 163 penetrating through the encapsulant 140 to connect each of the wiring patterns 162a and 162b to the wiring structure 130.

Figure 11A:
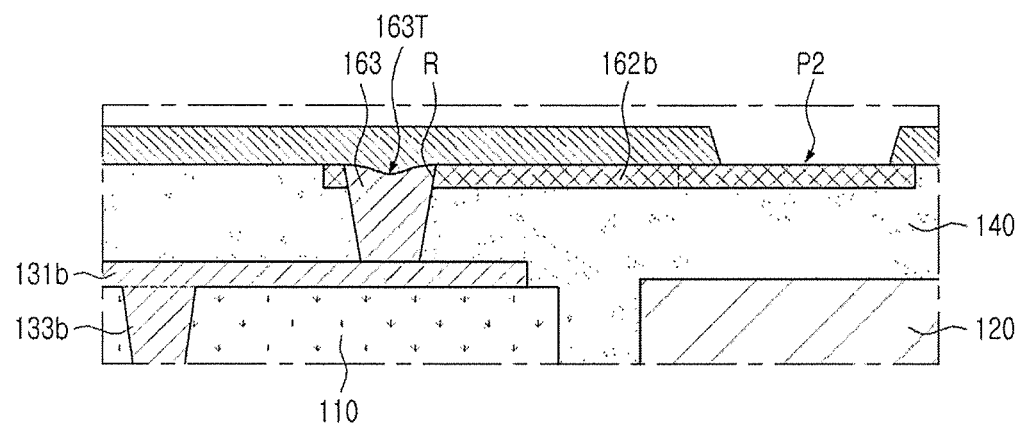
FIGS. 11A and 11B are, respectively, an enlarged cross-sectional view and a plan view illustrating a region (part A) of the fan-out semiconductor package illustrated in FIG. 9.
Figure 11B:
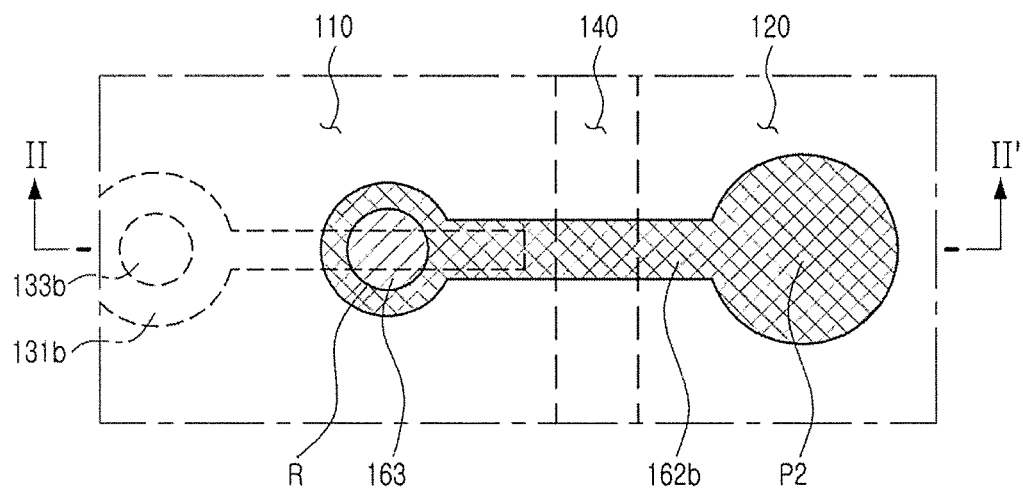

The structure of the second redistribution layer 160 used in the present exemplary embodiment will be described in more detail with reference to FIGS. 11A and 11B. FIGS. 11A and 11B are, respectively, an enlarged cross-sectional view and a partial plan view illustrating region A of the fan-out semiconductor package illustrated in FIG. 9.

Referring to FIGS. 11A and 11B, the wiring pattern 162b may be embedded in the encapsulant 140 so that one surface thereof is exposed. The exposed surface of the wiring pattern 162b may be substantially coplanar with a surface of the encapsulant 140, but is not limited thereto. For example, the exposed surface of the wiring pattern 162b may be at a level above the surface of the encapsulant 140 or may be at a level below the surface of the encapsulant 140 so that at least regions (for example, pad regions) may be exposed.

The connection via 163 may pass through the wiring pattern 162b and then be connected to the upper pattern 131b of the wiring structure. As illustrated in FIG. 11B, the wiring pattern 162b may have a connection region R having a shape such as a ring shape. The connection via 163 may be formed after the wiring pattern 162b is provided. In this case, the connection via 163 may be easily formed using the connection region R having a hole of the wiring pattern 162b (see FIG. 13B). Since the connection via 163 used in the present exemplary embodiment is formed by a different process (plating) from the formation process for the wiring pattern 162b, an interface such as a grain boundary may be observed between the connection via 163 and the wiring pattern 162b.

The width of the region of the connection via 163 in contact with the wiring patterns 162a and 162b may be greater than that of the region in contact with the wiring structure 130. An upper surface 163T of the connection via 163 may have a recessed region at a central portion thereof. In the present exemplary embodiment, other wiring patterns 162a and other connection vias 163 constituting the second redistribution layer 160 may also have a structure similar to the structure described above.

An array of a plurality of first and second pads P1 and P2 corresponding to an array of connection terminals of another semiconductor chip/package that is to be disposed on the fan-out semiconductor package 100 according to the present exemplary embodiment may be provided using such a second redistribution layer 160.

A first passivation layer 171 may be formed on the surface of the encapsulant 140 in which the second redistribution layer 160 is formed. The first passivation layer 171 may have first openings O1 defining regions of the plurality of first and second pads P1 and P2. The first openings O1 may be formed to correspond to the array of the connection terminals of another semiconductor chip/package that is to be disposed on the fan-out semiconductor package 100.

The plurality of first and second pads P1 and P2 may be arrayed as illustrated in FIG. 10A. The wiring patterns 162a and 162b used in the present exemplary embodiment may be divided into fan-in wiring patterns 162a and fan-out wiring patterns 162b depending on a redistribution position. The first pads P1 provided by the fan-in wiring patterns 162a may be disposed in a region in which they do not overlap the semiconductor chip 120, that is, a fan-out region, and the second pads P2 provided by the fan-out wiring patterns 162b may be disposed in a region in which they overlap the semiconductor chip 120, that is, a fan-in region.

A exemplary second redistribution layer 160 used in the present exemplary embodiment is illustrated by way of example as a single layer structure, but the second redistribution layer 160 may also be implemented in a multiple layer structure having two or more layers. This will be described in detail with reference to FIG. 19.

The respective components included in the fan-out semiconductor package 100 according to the present exemplary embodiment will hereinafter be described in more detail.

The supporting member 110 may maintain rigidity of the fan-out semiconductor package 100. The semiconductor chip 120 may be disposed in the cavity 110X of the supporting member 110, and may be fixed by the encapsulant 140. The supporting member 110 may provide an extended routing region to the fan-out semiconductor package 100, and improve the degree of freedom in the design of the fan-out semiconductor package 100. The wiring structure 130 of the supporting member 110 used in the present exemplary embodiment is only an example, and may be variously modified. For example, the wiring structure 130 may further include one or more patterns positioned on an intermediate level of the supporting member 110. These patterns may include, for example, ground (GND) patterns, power (PWR) patterns, and signal patterns, in addition to redistribution patterns. The wiring structure 130 may be formed before the semiconductor chip 120 is disposed, which may suppress a decrease in yield due to the semiconductor chip 120.

An insulating material may be used as the material of the supporting member 110. The insulating material may be a thermosetting resin such as an epoxy resin, a thermoplastic resin such as a polyimide resin, a resin in which a thermosetting resin or a thermoplastic resin is impregnated in a reinforcement material such as a glass fiber and/or an inorganic filler, for example, prepreg, Ajinomoto Build up Film (ABF), FR-4, Bismaleimide Triazine (BT), or the like. Alternatively, a photosensitive insulating material such as a photoimagable dielectric (PID) resin may be used as the insulating material. As another example, a metal having excellent rigidity and thermal conductivity may be used. In this case, an Fe—Ni based alloy may be used as the metal. Cu plating may also be formed on a surface of the Fe—Ni based alloy in order to secure adhesion between the Fe—Ni based alloy and the encapsulant, another interlayer insulating material, and the like. The supporting member 110 is not limited thereto, but may also be formed of glass, ceramic, plastic, or the like. The wiring structure 130 is not limited thereto, may include a conductive material such as copper (Cu), aluminum (Al), silver (Ag), tin (Sn), gold (Au), nickel (Ni), lead (Pb), or alloys thereof.

The connection member 150 may be configured to basically redistribute the connection pads 120P of the semiconductor chip 120. Several tens to several hundreds of connection pads 120P having various functions may be redistributed by the connection member 150, and may be physically and/or electrically connected to an external apparatus through connection terminals 175. The connection member 150 may be connected to the connection pads 120P of the semiconductor chip 120, and support the semiconductor chip 120.

As described above, the connection member 150 may include the insulating layer 151 and the first redistribution layer 155 formed on the insulating layer 151. In the present exemplary embodiment, the first redistribution layer 155 may include the first wiring patterns 152a on the first insulating layer 151a and the second wiring patterns 152b on the second insulating layer 151b. The first wiring patterns 152a may be connected to the connection pads 120P of the semiconductor chip 120 and the wiring structure 130 by the first vias 153a formed in the first insulating layer 151a. The second wiring patterns 152b may be connected to the first wiring patterns 152a by the second vias 153b formed in the second insulating layer 151b. The first redistribution layer 155 is not limited thereto, and may include a single layer or layers more than two layers.

The insulating layer 151 may include a thermosetting resin such as an epoxy resin, a thermoplastic resin such as a polyimide resin, a resin in which a thermosetting resin or a thermoplastic resin is impregnated in a reinforcement material such as an inorganic filler, similar to the above-mentioned other insulator, and a photosensitive insulating material such as a PID resin may be used as a material of the insulating layer 151. The first redistribution layer 155 may include a conductive material such as copper (Cu), aluminum (Al), silver (Ag), tin (Sn), gold (Au), nickel (Ni), lead (Pb), or alloys thereof. A surface treatment layer may be further formed on exposed regions of the first redistribution layer 155, if necessary.

As described above, the connection member 150 may be electrically connected directly to the semiconductor chip 120, and the wiring structure 130 of the supporting member 110 may be bypassed to the first redistribution layer 155 of the connection member 150 to be electrically connected to the semiconductor chip 120.

The encapsulant 140 may be configured to protect the semiconductor chip 120. In the present exemplary embodiment, the encapsulant 140 may encapsulate the first surface 110A of the supporting member 110 as well as the semiconductor chip 120. An encapsulation form of the encapsulant 140 is not particularly limited and may be a form in which the encapsulant 140 surrounds the semiconductor chip 120. For example, the encapsulant 140 may cover the semiconductor chip 120, and may fill the remaining space within the cavity 110X of the supporting member 110. The encapsulant 140 may fill the cavity 110X to thus serve as an adhesive and reduce buckling of the semiconductor chip 120. The encapsulant 140 may cover all surfaces of the semiconductor chip 120 other than a lower surface of the semiconductor chip 120. The encapsulant 140 may only cover portions of the lower surface of the semiconductor chip 120, depending on positions and shapes of the connection pads 120P of the semiconductor chip 120. In some exemplary embodiments, the encapsulant 140 may include a plurality of layers formed of a plurality of materials. For example, a space in the cavity 110X may be filled with a first encapsulant, and the first surface 110A of the supporting member 110 and the semiconductor chip 120 may be covered with a second encapsulant different from the first encapsulant.

The material of the encapsulant 140 is not particularly limited and may be thermosetting resin such as an epoxy resin, a thermoplastic resin such as a polyimide resin, a resin in which a thermosetting resin or a thermoplastic resin is impregnated in a reinforcement material such as a glass fiber and/or an inorganic filler, for example, prepreg, ABF, or the like. In addition, a known molding material such as an epoxy molding compound (EMC), or the like, may be used. In some exemplary embodiments, a material including a glass fiber and/or an inorganic filler and an insulating resin may be used as a material of the encapsulant 140 to effectively suppress warpage of the fan-out semiconductor package.

In some exemplary embodiments, the encapsulant 140 may include conductive particles in order to block electromagnetic waves. For example, the conductive particles may include copper (Cu), aluminum (Al), silver (Ag), tin (Sn), gold (Au), nickel (Ni), lead (Pb), solder, or the like, but are not limited thereto.

The fan-out semiconductor package 100 according to the present exemplary embodiment may include a second passivation layer 172 below the connection member 150, similar to the first passivation layer 171 on the encapsulant 140 in which the second redistribution layer 160 is formed.

The first and second passivation layers 171 and 172 may be configured to protect the second redistribution layer 160 and the connection member 150, respectively, from external physical or chemical damage, or the like. The second passivation layer 172 may have second openings O2 exposing at least portions of the second wiring patterns 152b of the connection member 150, similar to the first passivation layer described above.

The material of each of the first and second passivation layers 171 and 172 is not particularly limited. For example, a solder resist may be used as the material of each of the first and second passivation layers 171 and 172. In some exemplary embodiments, the same or similar material used as the material of the supporting member 110 and/or the connection member 150 may be used as the material of each of the first and second passivation layers 171 and 172.

The fan-out semiconductor package 100 according to the present exemplary embodiment may further include the connection terminals 175 in the second openings O2 of the second passivation layer 172 and exposed externally. The connection terminals 175 may be configured to physically or electrically connect the fan-out semiconductor package 100 to the external apparatus. For example, the fan-out semiconductor package 100 may be mounted on the motherboard of the electronic device through the connection terminals 175. The connection terminals 175 may be connected to the second wiring patterns 152b exposed by the second openings O2. In some exemplary embodiments, an additional underbump metallurgy (UBM) layer may be formed on the second wiring patterns 152b, and the connection terminals 175 may be formed.

For example, the connection terminals 175 may be formed of copper (Cu), aluminum (Al), silver (Ag), tin (Sn), gold (Au), nickel (Ni), lead (Pb), solder, or the like, but is not limited thereto, and the connection terminals 175 may have various structures such as lands, balls, pins, and the like.

As illustrated in FIG. 10B, some of the connection terminals 175 may be in a fan-out region. A fan-out package may have excellent reliability as compared to a fan-in package, may implement a plurality of input/output (I/O) terminals, and may facilitate a 3D interconnection. An array (the number, an interval, or the like) of the connection terminals 175 is not particularly limited, but may be variously modified depending on a condition of an external apparatus that is to be mounted.

In the present exemplary embodiment, the connection terminals 175 are illustrated as only being on a lower surface of the connection member 150, but connection terminals similar to the connection terminals 175 may also be provided on the second redistribution layer 160, that is, the first and second pads P1 and P2, if necessary.

FIGS. 12A through 12H are cross-sectional views illustrating a process of forming a first redistribution layer and a lamination process of a method of manufacturing the fan-out semiconductor package illustrated in FIG. 9.

Contents overlapping those described above are omitted or described briefly.

Figure 12A:
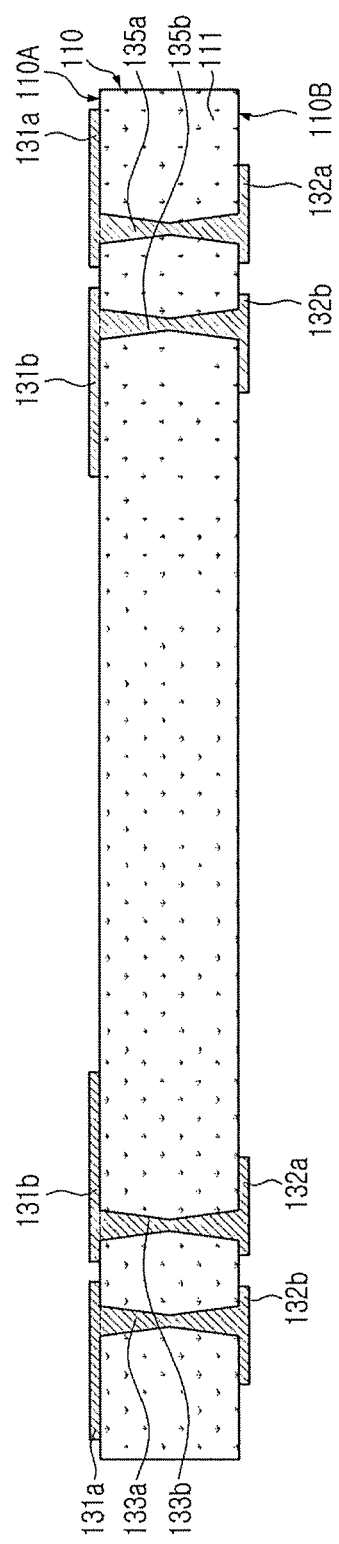

Referring to FIG. 12A, wiring structures 130 may be formed on opposite surfaces of an insulating member 111.

The insulating member 111 may be a copper clad laminate (CCL) having thin metal layers, for example, copper foils (not illustrated), formed on upper and lower surfaces thereof. The copper foils may be used as seed layers for forming patterns. The through-vias 133a and 133b may be formed in the insulating member 111. The upper patterns 131a and 131b and the lower patterns 132a and 132b may be formed on and below the insulating member 111, respectively. Holes for the through-vias 133a and 133b may be formed using a mechanical drill and/or a laser drill (for example, a $CO_2$ laser drill or a YAG laser drill). A desmearing process may be performed to remove a resin smear in the holes (not illustrated). The through-vias 133a and 133b, the upper patterns 131a and 131b, and the lower patterns 132a and 132b may be formed by electro copper plating, electroless copper plating, or the like, using dry film patterns. In more detail, the through-vias 133a and 133b, the upper patterns 131a and 131b, and the lower patterns 132a and 132b may be formed by a method such as a subtractive process, an additive process, a semi-additive process (SAP), a modified semi-additive process (MSAP), or the like, but are not limited thereto. That is, the through-vias 133a and 133b, the upper patterns 131a and 131b, and the lower patterns 132a and 132b may also be formed by a method such as chemical vapor deposition (CVD), physical vapor deposition (PVD), or sputtering, if necessary.

Then, referring to FIG. 12B, the cavity 110X penetrating through the first surface 110A and the second surface 110B of the supporting member 110 may be formed.

The method of forming the cavity 110X is also not particularly limited. The cavity 110X may be formed by, for example, a mechanical drill and/or a laser drill, a sand blasting method using particles for polishing, a dry etching method using plasma, or the like. When the cavity 110X is formed using the mechanical drill and/or the laser drill, a desmearing process may be performed to remove a resin smear in the cavity 110X. The size and shape of the cavity 110X may be designed depending on sizes, shapes, the number, and the like, of semiconductor chips 120 (see FIG. 12C) that are to be mounted in the cavity 110X.

Figure 12C:
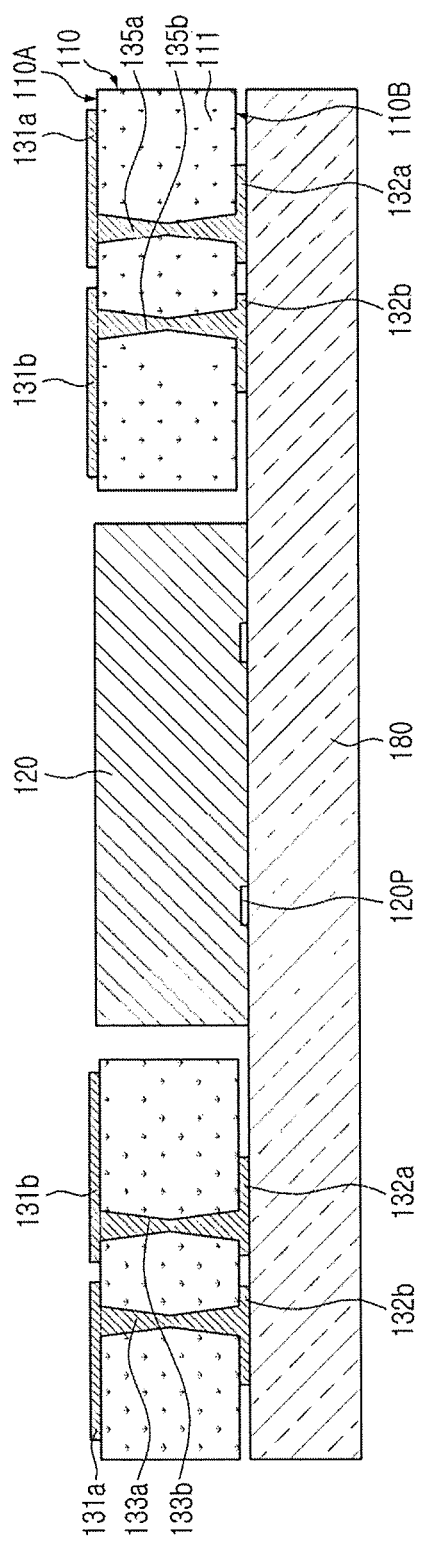

Referring to FIG. 12C, an adhesive support 180 may be attached to the second surface 110B of the supporting member 110, and the semiconductor chip 120 may be disposed in the cavity 110X.

The adhesive support 180 may be various support members having an adhesive surface that may fix the supporting member 110. For example, various types of adhesive tapes such as a thermosetting adhesive tape of which adhesion is weakened by heat treatment, an ultraviolet-curable adhesive tape of which adhesion is weakened by ultraviolet ray irradiation, and the like, may be used as the adhesive support 180.

The semiconductor chip 120 may be attached to and disposed on the adhesive support 180 in the cavity 110X. The connection pads 120P of the semiconductor chip 120 may be attached to the adhesive support 180 (face-down). When the connection pads 120P of the semiconductor chip 120 have an embedded form, the second surface 110B of the supporting member 110 and the lower surface of the semiconductor chip 120 may be substantially coplanar with each other. In contrast, when the connection pads 120P of the semiconductor chip 120 have a protruding form, the second surface 110B of the supporting member 110 and lower surfaces of the connection pads 120P may be substantially coplanar with each other.

Figure 12D:
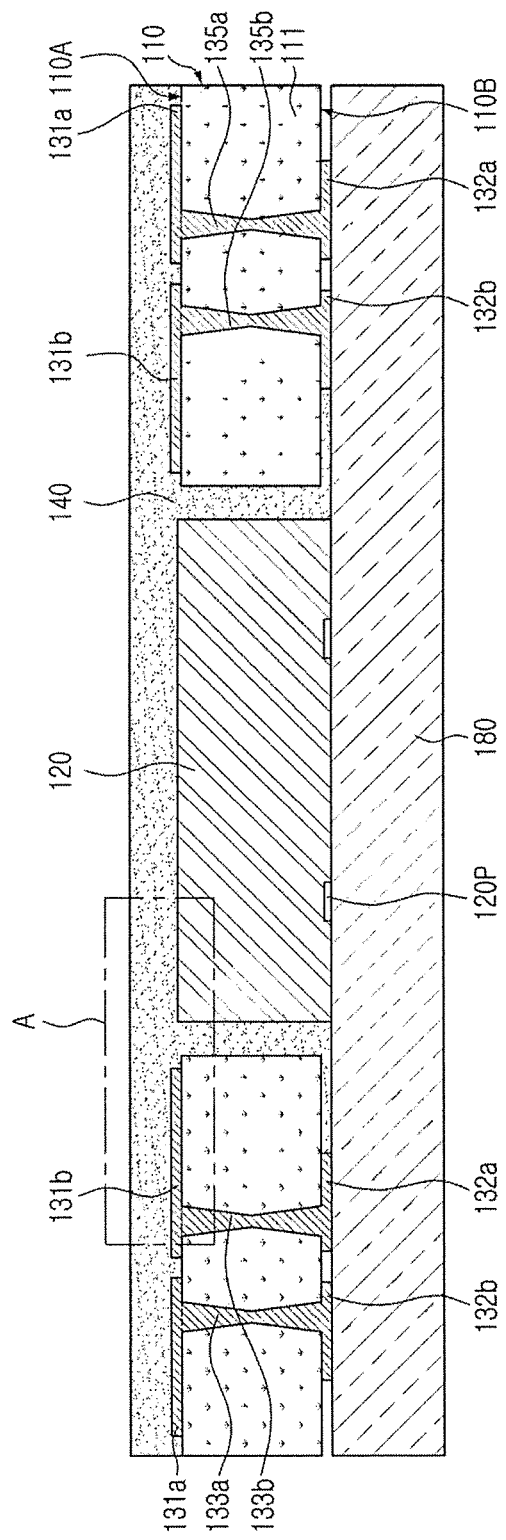

Referring to FIG. 12D, the semiconductor chip 120 may be encapsulated using the encapsulant 140, and the first surface 110A of the supporting member 110 may be covered with the encapsulant 140.

The encapsulant 140 may cover the supporting member 110 and the semiconductor chip 120, and may fill the space within the cavity 110X. The encapsulant 140 may be formed by known methods. The pre-encapsulant may be formed, for example, by a screen printing method of applying ink with a squeegee, a spray printing method of applying ink in a mist form, or the like, may be used. In some exemplary embodiments, the encapsulant 140 may be formed by laminating and then hardening a precursor of the encapsulant 140.

Figure 12E:
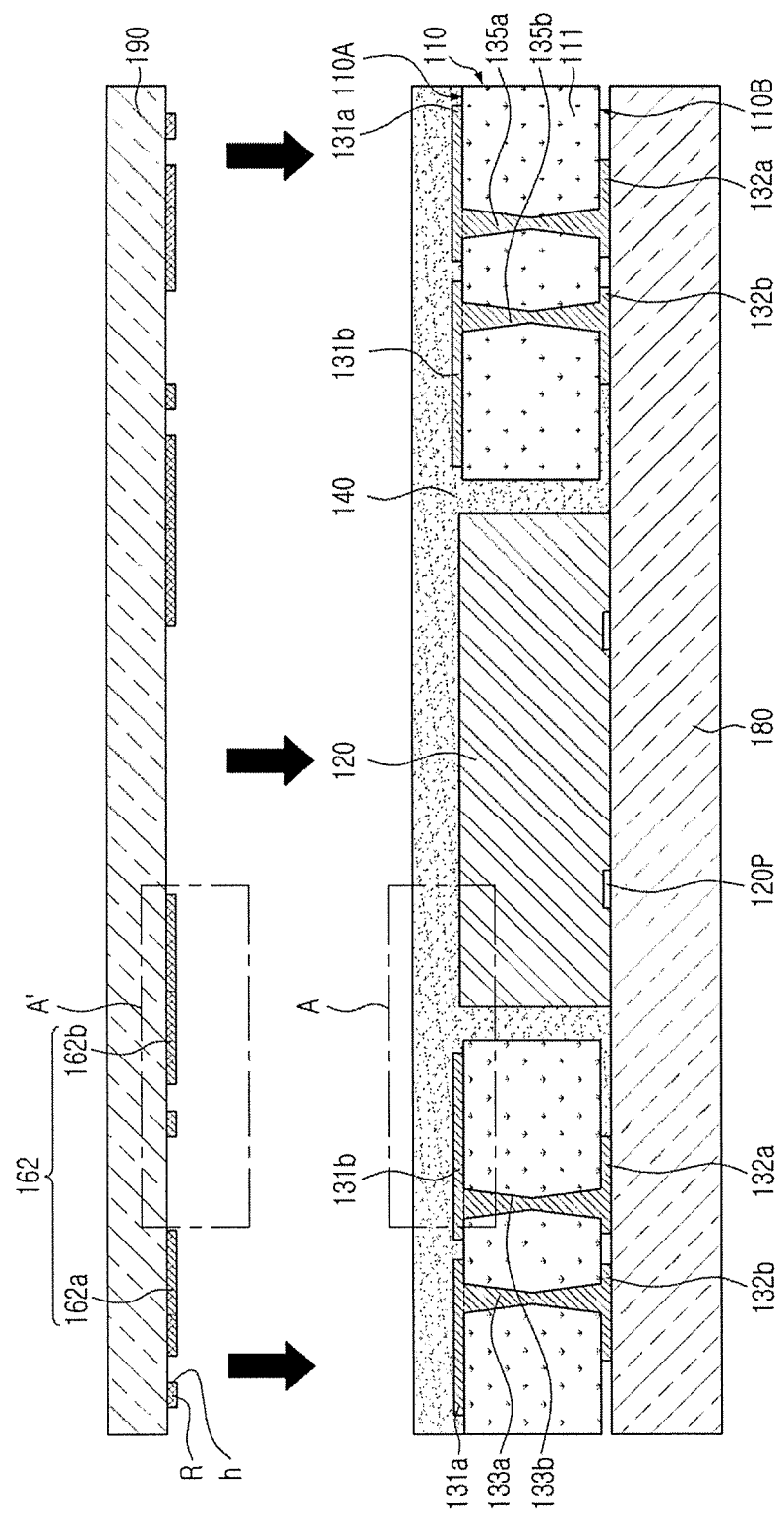
Figure 12F:
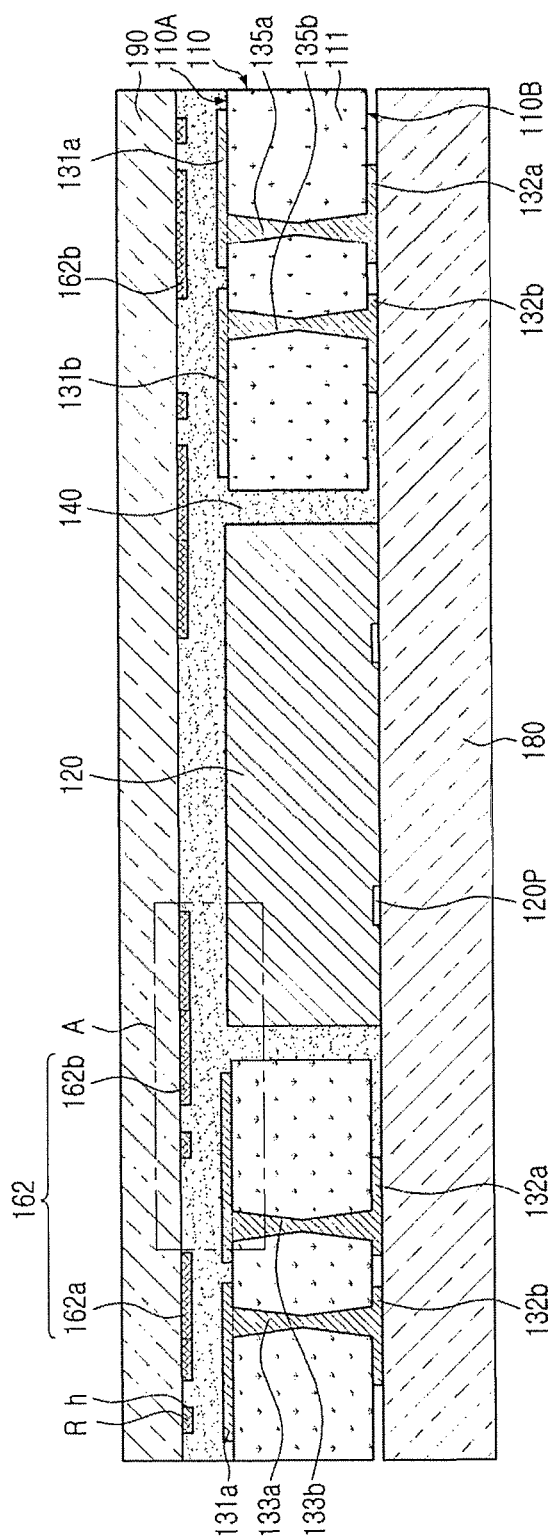

However, in the present exemplary embodiment, before the material for forming the encapsulant 140 is completely hardened (for example, when it is only semi-hardened), the wiring patterns 162 on a temporary support 190 may be transferred to be embedded in the surface of the encapsulant 140 (see FIGS. 12E and 12F).

As illustrated in FIG. 12E, the wiring patterns 162 for a second redistribution layer below the temporary support 190 may be laminated on the surface of the encapsulant that is not hardened or is semi-hardened.

Figure 14:
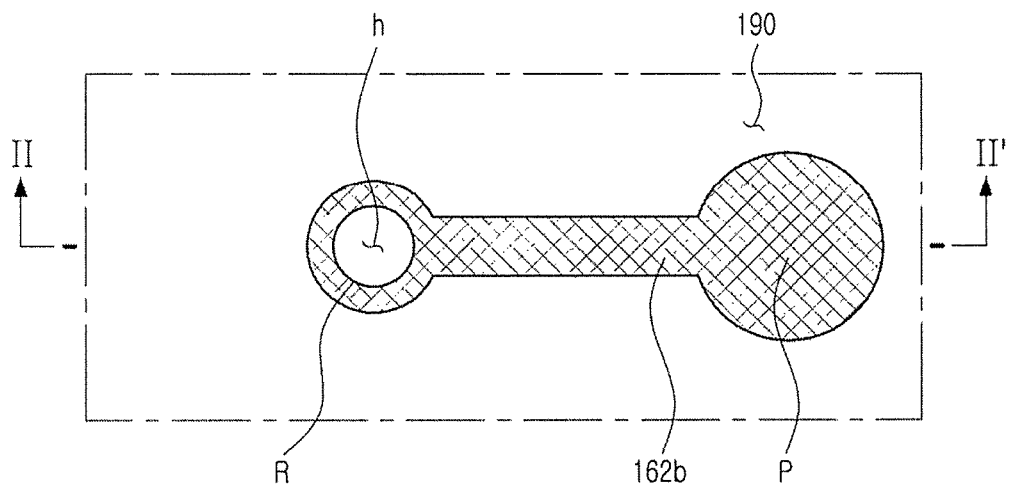
FIG. 14 is a plan view illustrating a region (part A') of a redistribution layer illustrated in FIG. 12E.

The temporary support 190 may be a copper clad laminate having thin metal layers, for example, copper foils (not illustrated), formed on upper and lower surfaces thereof, but is not limited thereto. A release layer may be formed on the copper foil or surface treatment may be performed on the copper foil so that the wiring patterns 162 are easily separated in a subsequent process. The wiring patterns 162a and 162b may be formed by a plating process using the copper foil as a seed layer, and may include, respectively, the connection regions R having the holes h. The holes "h" refer to open regions in which conductors are not formed in order to easily form connection vias. As illustrated in FIG. 14, the connection regions "R" of the wiring patterns 162b may have a ring shaped structure having a relatively large width.

The present process may be performed in a rivet pin matching manner without using a separate matching equipment. That is, the temporary support 190 may be fixed together with the adhesive support 180 or a support member by rivet pins to accurately align positions of the wiring patterns 162 that are to be laminated in each package unit. As described above, the present process may be easily performed in a simple vacuum lamination stacking manner while securing accurate alignment using the rivet pins.

As illustrated in FIG. 12F, the wiring patterns 162 may be embedded in the surface of the encapsulant 140.

Since the encapsulant 140 is in a non-hardened state, for example, a semi-hardened state, the wiring patterns 162 may be formed to be convex, as compared to a surface of the temporary support, and may be embedded in the surface of the encapsulant 140 by a lamination process. When the lamination process is used, it may be performed in a manner of performing a hot press process of pressing the wiring patterns for a predetermined time at a high temperature, reducing the pressure of pressing the wiring patterns, and cooling the wiring patterns to room temperature, and then additionally cooling the wiring patterns in a cold press.

Figure 15A:
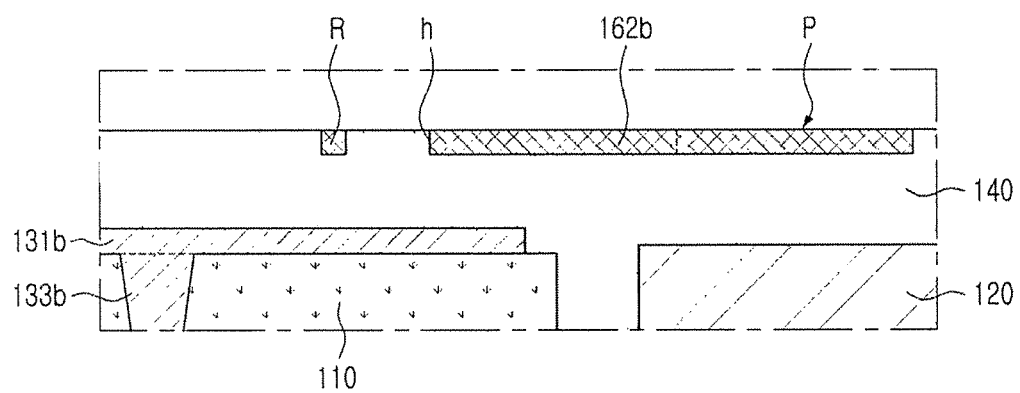
FIGS. 15A and 15B are, respectively, a cross-sectional view and a plan view illustrating a region (part A) of a redistribution layer illustrated in FIG. 12F.
Figure 15B:
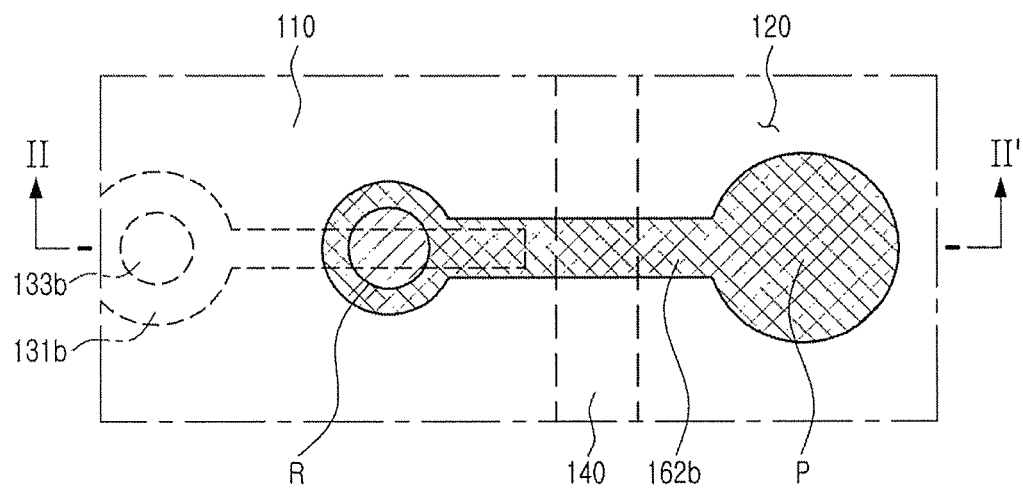

The embedded wiring pattern 162b may be disposed to overlap an upper pattern 131b of the wiring structure 130 to which it is to be connected, as illustrated in FIGS. 15A and 15B, and particularly, the hole h of the connection region R may be disposed on a region of the upper pattern 131b to overlap the region of the upper pattern 131b. Similarly, a hole h of a connection region R of another wiring pattern 162a may also be disposed on a region of the upper pattern 131a, which is a connection target, to overlap the region of the upper pattern 131a. A complete hardening process may be performed on the encapsulant when the wiring patterns 162a and 162b are embedded in the encapsulant. Even after the wiring patterns 162a and 162b are embedded in the encapsulant, the temporary support 190 may be maintained in a process of forming the first redistribution layer (or the connection member) to thus be utilized as a support.

Figure 12G:
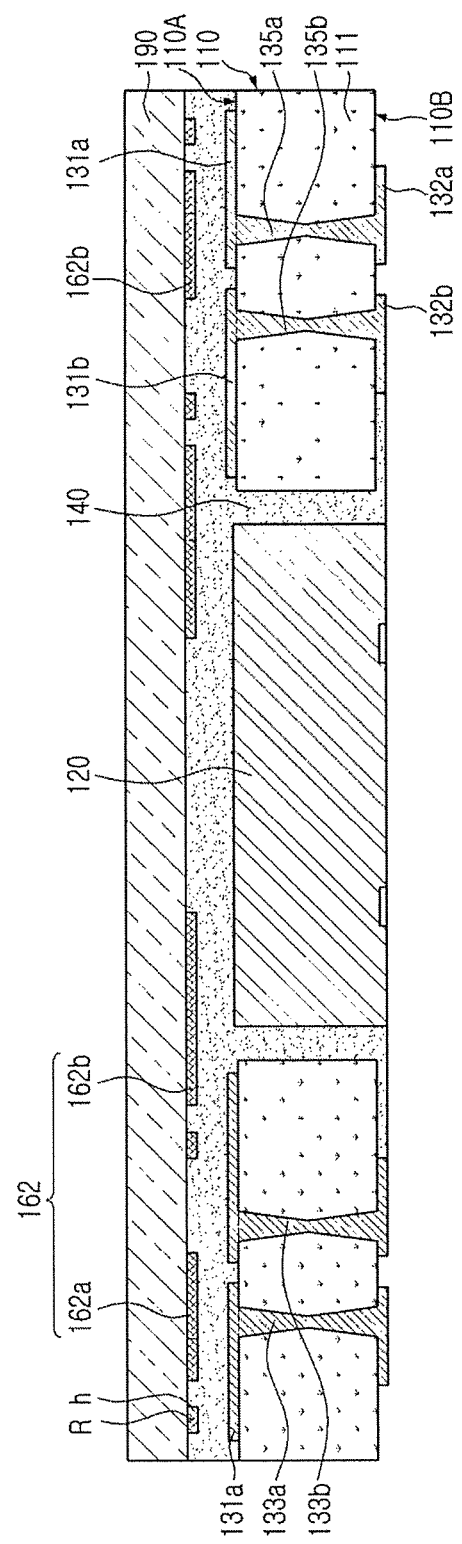

Referring to FIG. 12G, the adhesive support 180 may be removed from the supporting member 110 and the semiconductor chip 120.

The present removing process is not particularly limited, and may be performed by various methods. For example, when the thermosetting adhesive tape of which the adhesion is weakened by the heat treatment, the ultraviolet-curable adhesive tape of which the adhesion is weakened by the ultraviolet ray irradiation, or the like, is used as the adhesive support 180, the adhesive support 180 may be removed after the adhesion of the adhesive support 180 is weakened by heat-treating the adhesive support 180 or may be removed after the adhesion of the adhesive support 180 is weakened by irradiating the adhesive support 180 with an ultraviolet ray. As described above, the temporary support 190 may be used as a support in a process of forming the first redistribution layer.

Figure 12H:
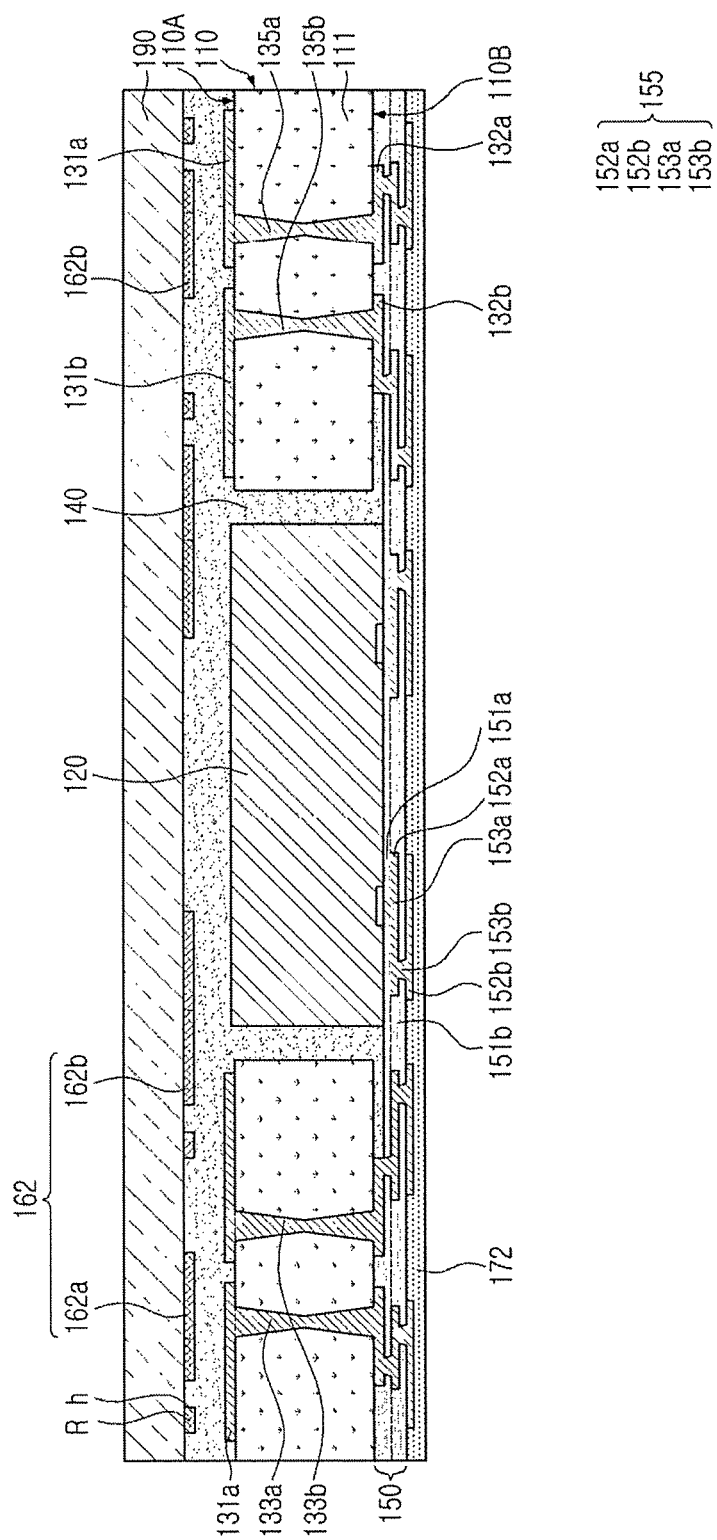

Referring to FIG. 12H, the connection member 150 having the first redistribution layer 155 may be formed on lower surfaces of the supporting member 110 and the semiconductor chip 120, and the second passivation layer 172 disposed below the connection member 150 may be formed.

In the present exemplary embodiment, the first insulating layer 151a may be formed. Holes connected to the connection pads 120P of the semiconductor chip 120 and the first and second lower patterns 132a and 132b of the wiring structure 130 may be formed. The holes may be filled using a dry film to form the first vias 153a. The first wiring patterns 152a may be formed on a desired surface of the first insulating layer 151a. Similarly, the second insulating layer 151b may be formed, and the second vias 153b and the second wiring patterns 152b may be formed to be connected to the first wiring patterns 152a. The first and second insulating layers 151a and 151b may be formed of a photosensitive insulating material such as PID, but are not limited thereto. The second passivation layer 172 may also be formed by a method of laminating a precursor of the second passivation layer 172 and then hardening the precursor, a method of applying a material for forming the second passivation layer 172 and then hardening the material, or the like.

A process of forming the second redistribution layer 160 disposed on the first surface 110A of the supporting member 110 may then be performed. A process of forming the connection vias connecting the embedded wiring patterns to the wiring structure may be performed. FIGS. 13A through 13D are cross-sectional views illustrating a process of forming connection vias of the method of manufacturing the fan-out semiconductor package illustrated in FIG. 9.

Figure 13A:
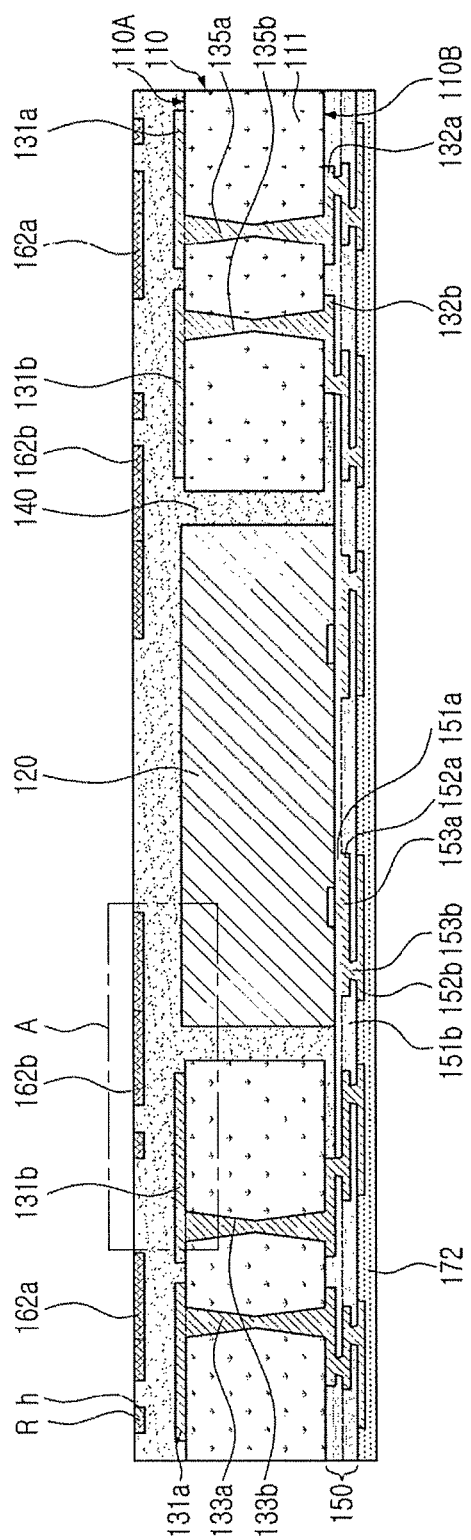
FIGS. 13A through 13D are cross-sectional views illustrating a process of forming connection vias of a method of manufacturing the fan-out semiconductor package illustrated in FIG. 9.

First, referring to FIG. 13A, after the connection member 150 is formed, the temporary support 190 may be removed from the surface of the encapsulant 140.

The temporary support 190 may be removed so that the embedded wiring patterns 162 remain in the surface of the encapsulant 140. The temporary support 190 may be easily removed using a separating member such as the release layer described above, or the like. The process of removing the temporary support 190 may be easily performed after adhesion of the temporary support 190 is weakened using heat treatment, an ultraviolet ray, or the like, depending on characteristics of the temporary support or the release layer. As illustrated in FIGS. 15A and 15B, the wiring pattern 162b may be disposed to overlap the upper pattern 131b of the wiring structure, which is a connection target, through the previous process. Particularly, the wiring pattern 162b may be embedded in the surface of the encapsulant 140 so that the hole h of the connection region R overlaps a connection region of the upper pattern 131b in which the connection via is to be formed.

Figure 13B:
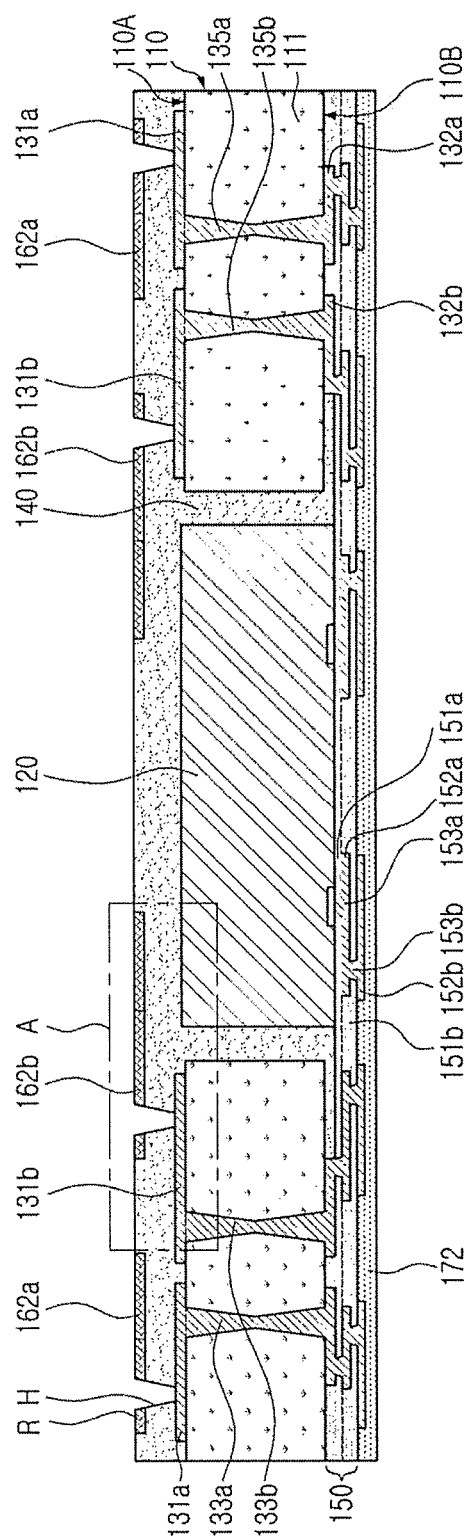

As illustrated in FIG. 13B, via holes H connecting the connection regions of the wiring patterns 162a and 162b and the upper patterns 131a and 131b to each other, respectively, may be formed.

Figure 16A:
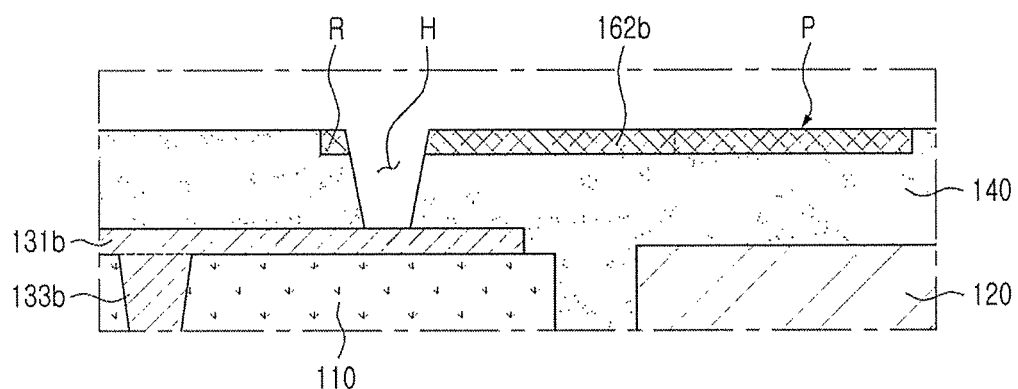
FIGS. 16A and 16B are, respectively, a cross-sectional view and a plan view illustrating a region (part A) of a redistribution layer illustrated in FIG. 13B.
Figure 16B:
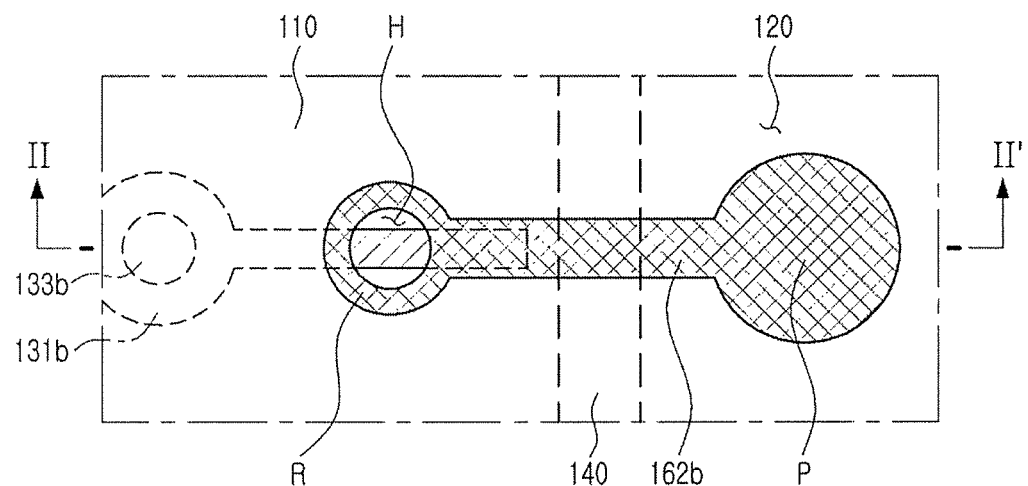

The present process may be performed using a mechanical drill and/or a laser drill. A drilling process may be easily performed since only regions of the encapsulant 140 are drilled due to the holes h provided in the connection regions R in advance. When the via holes H are formed using the mechanical drill and/or the laser drill, a desmearing process may be performed on the via holes H using a permanganate method, or the like, to remove a resin smear. As illustrated in FIGS. 16A and 16B, the via hole H may be formed along the hole h disposed in the connection region R of the wiring pattern 162b, and the connection region R of the wiring pattern 162b may be exposed to the connection region of the upper pattern 131b through the via hole H.

Figure 13C:
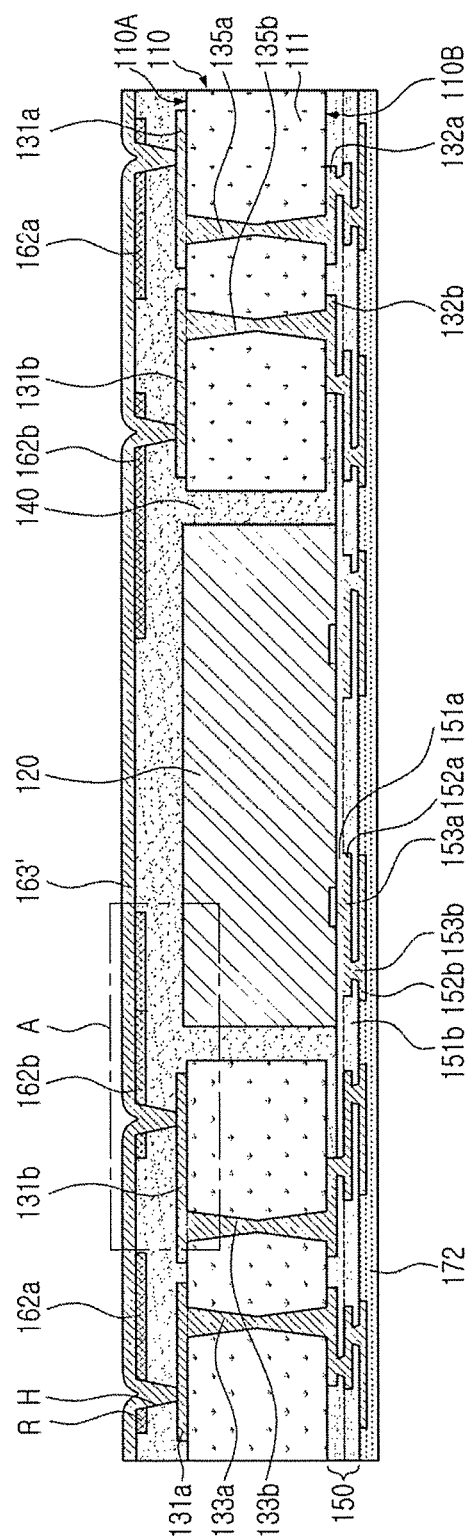

As illustrated in FIG. 13C, a plating layer 163' may be formed on the encapsulant 140 in which the wiring patterns 162a and 162b are embedded so that inner portions of the via holes H are filled.

Figure 17:
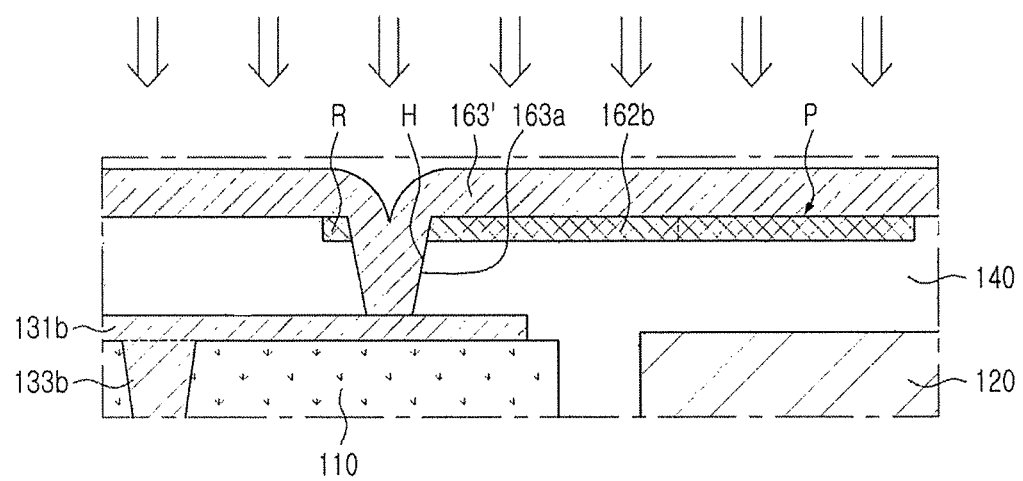
FIGS. 17 and 18 are cross-sectional views illustrating regions (part A) of redistribution layers illustrated in FIGS. 13C and 13D, respectively.

The plating layer 163' may be obtained by forming a seed layer on the surface of the encapsulant 140 as well as inner surfaces of the via holes H and then performing a plating process on the seed layer. The plating layer 163' formed as described above may fill the inner portions of the via holes H (see FIG. 17).

Figure 13D:
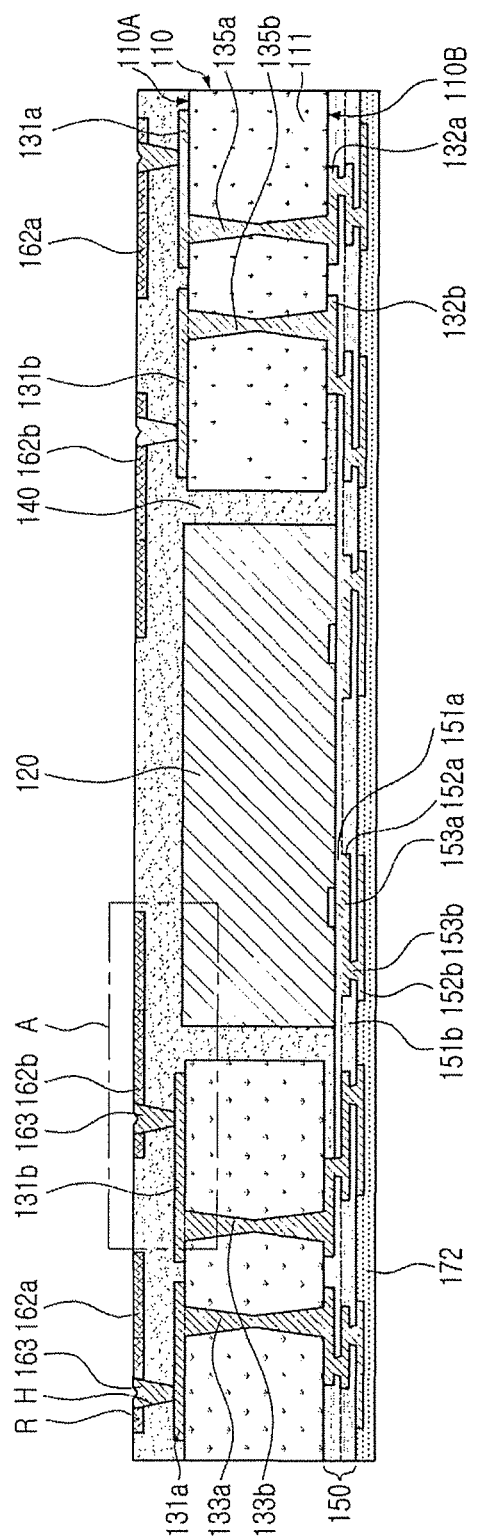

As illustrated in FIG. 13D, portions of the plating layer on the encapsulant 140 may be removed so that the connection vias 163 are formed.

Figure 18:
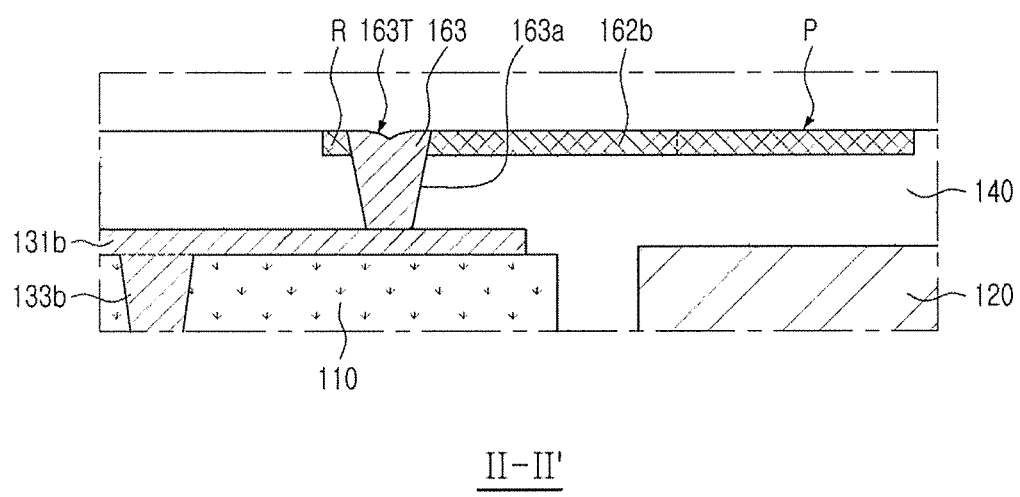

Such a removing process may be performed by an etch back or grinding process. Portions of the plating layer remaining in the via holes may be provided as the connection vias 163. The connection vias 163 obtained in the present process may connect the upper patterns 131a and 131b of the wiring structure 130 and the wiring patterns 162a and 162b to each other, and may provide a desired second redistribution layer 160 together with the wiring patterns 162a and 162b. Due to the present process, as illustrated in FIG. 18, the exposed surfaces of the wiring patterns 162a and 162b of the second redistribution layer 160 may be substantially coplanar with the surface of the encapsulant 140. In addition, the upper surface 163T of the connection via 163 may have a structure in which a central portion thereof is recessed. In some exemplary embodiments, a process of removing residuals from the surfaces of the embedded wiring patterns 162a and 162b may be additionally performed.

The first passivation layer may be formed, similar to the second passivation layer, and a plurality of first and second openings O1 and O2 may be formed in the first and second passivation layers 171 and 172, respectively. The connection terminals 175 may be formed in the second openings O2 to manufacture the semiconductor package 100 illustrated in FIG. 9. Connection terminals may be additionally formed in the first openings O1, if necessary.

Figure 19:
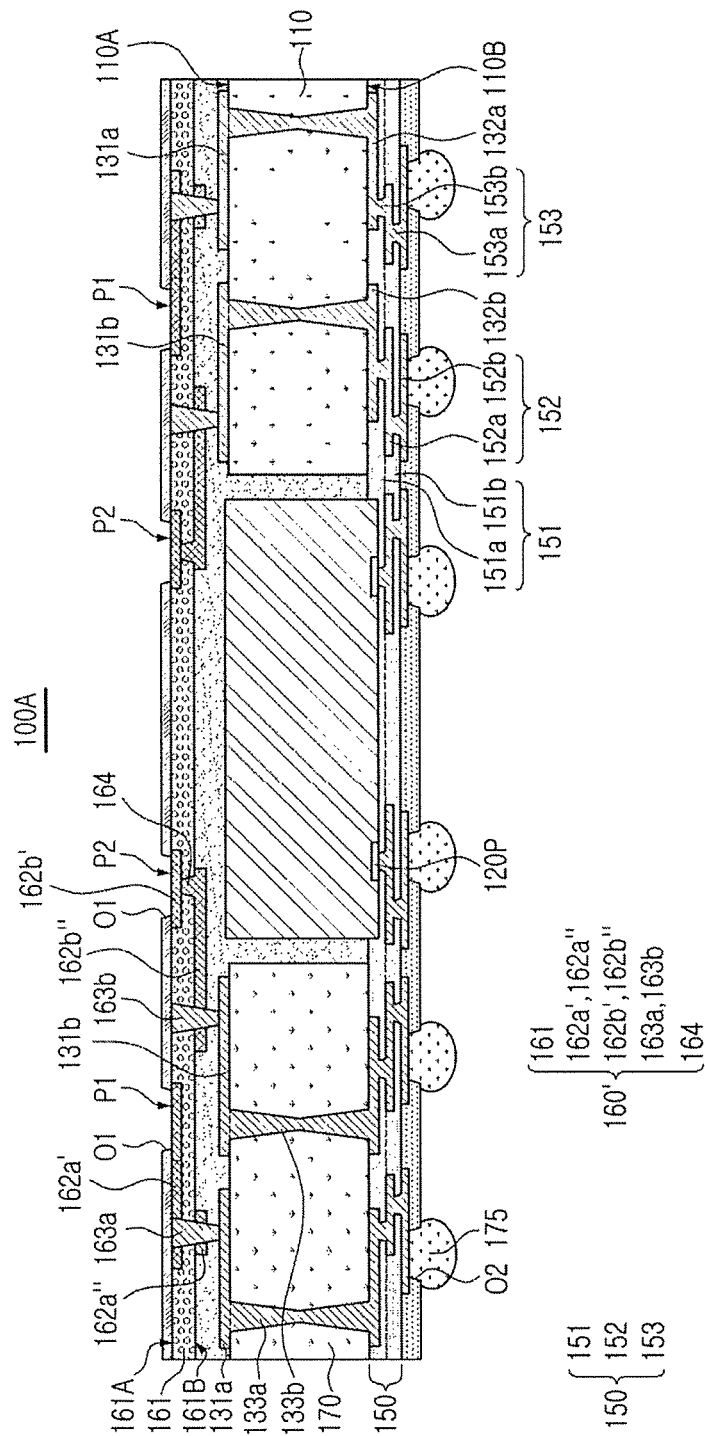
FIG. 19 is a side cross-sectional view illustrating a fan-out semiconductor package according to another exemplary embodiment in the present disclosure.

FIG. 19 is a side cross-sectional view illustrating a fan-out semiconductor package according to another exemplary embodiment in the present disclosure.

Referring to FIG. 19, a fan-out semiconductor package 100A according to the present exemplary embodiment may be understood to be similar to the fan-out semiconductor package 100 illustrated in FIGS. 9 through 11B except that a second redistribution layer 160' includes an insulating layer 161 and wiring patterns are configured in two levels. Components according to the present exemplary embodiments may be understood with reference to the description of the same or similar components of the fan-out semiconductor package 100 illustrated in FIGS. 9 through 11B unless explicitly described to the contrary.

The second redistribution layer 160' used in the present exemplary embodiment may further include an insulating layer 161 having first and second surfaces 161A and 161B opposing each other. The second surface 161B may be in contact with the encapsulant 140. The second redistribution layer 160' may include first wiring patterns 162a' and 162b' and second wiring patterns 162a" and 162b" disposed with the insulating layer 161 interposed therebetween.

The first wiring patterns 162a' and 162b' may be embedded in the first surface 161A of the insulating layer 161 so that each has an exposed surface. The second wiring patterns 162a" and 162b" may be on the second surface 161B of the insulating layer 161, and may be embedded in the encapsulant 140 so that each has an exposed surface.

The second redistribution layer 160' may include first and second connection vias 163a and 163b penetrating through the insulating layer 161 and the encapsulant 140.

The first connection vias 163a may connect the first wiring patterns 162a' and the second wiring patterns 162a" to the upper patterns 131a of the wiring structure 130. The second connection vias 163b may be separated from the first wiring patterns 162b', and may connect only the second wiring patterns 162b" to the upper patterns 131b of the wiring structure 130.

The first and second connection vias 163a and 163b may be formed after the first wiring patterns 162a' and 162b' and the second wiring patterns 162a" and 162b" are laminated. Therefore, the second connection vias 163b may be separated from the first wiring patterns 162b' and may penetrate through the insulating layer 161. In some exemplary embodiments, the second redistribution layer 160' may further include third connection vias (not illustrated) that penetrate through the insulating layer 161 and the encapsulant 140, are separated from the second wiring patterns 162a" and 162b", and are connected to the first wiring patterns 162a' and 162b' and the upper patterns 131a and 131b.

Regions of the first wiring patterns 162a' and the second wiring patterns 162a" through which the first connection vias 163a pass may have connection regions having holes, as described in the above-described exemplary embodiment. Regions of the second wiring patterns 162b" through which the second connection vias 163b pass may also have connection regions having holes (see FIG. 17).

The second redistribution layer 160' may include interlayer vias 164 penetrating through the insulating layer 161 to connect the first wiring patterns 162b' and the second wiring patterns 162b" to each other. The interlayer vias 164 can be formed such that they do not extend up to the encapsulant 160, in contrast to the first and second connection vias 163a and 163b. The interlayer vias 164 may have a structure integrated with the first wiring patterns 162b'. In the present specification, the term "integrated structure" does not mean that two components are simply in contact with each other, but refers to a structure in which two components are formed integrally with each other using substantially the same material by substantially the same process. That is, the interlayer vias 164 and the first wiring patterns 162b' may be considered as having an integrated structure in which they are simultaneously formed by the same plating process (see a process of FIG. 20B).

The first and second connection vias 163a and 163b and the interlayer vias 164 may be formed by different processes. In some exemplary embodiments, the widths of portions of the first and second connection vias 163a and 163b in contact with the upper patterns 131a and 131b of the wiring structure 130 may be smaller than the widths of portions of the first and second connection vias 163a and 163b adjacent to the first surface 161A of the insulating layer 161. In addition, the widths of portions of the interlayer vias 164 in contact with the second wiring patterns 162b" may be greater than the widths of portions of the interlayer vias 164 in contact with the first wiring patterns 162b'.

The second redistribution layer 160' that may be used in the present exemplary embodiment is not limited to a two-level redistribution layer, and may be implemented in three or more levels by including two or more insulating layers.

Figure 20A:
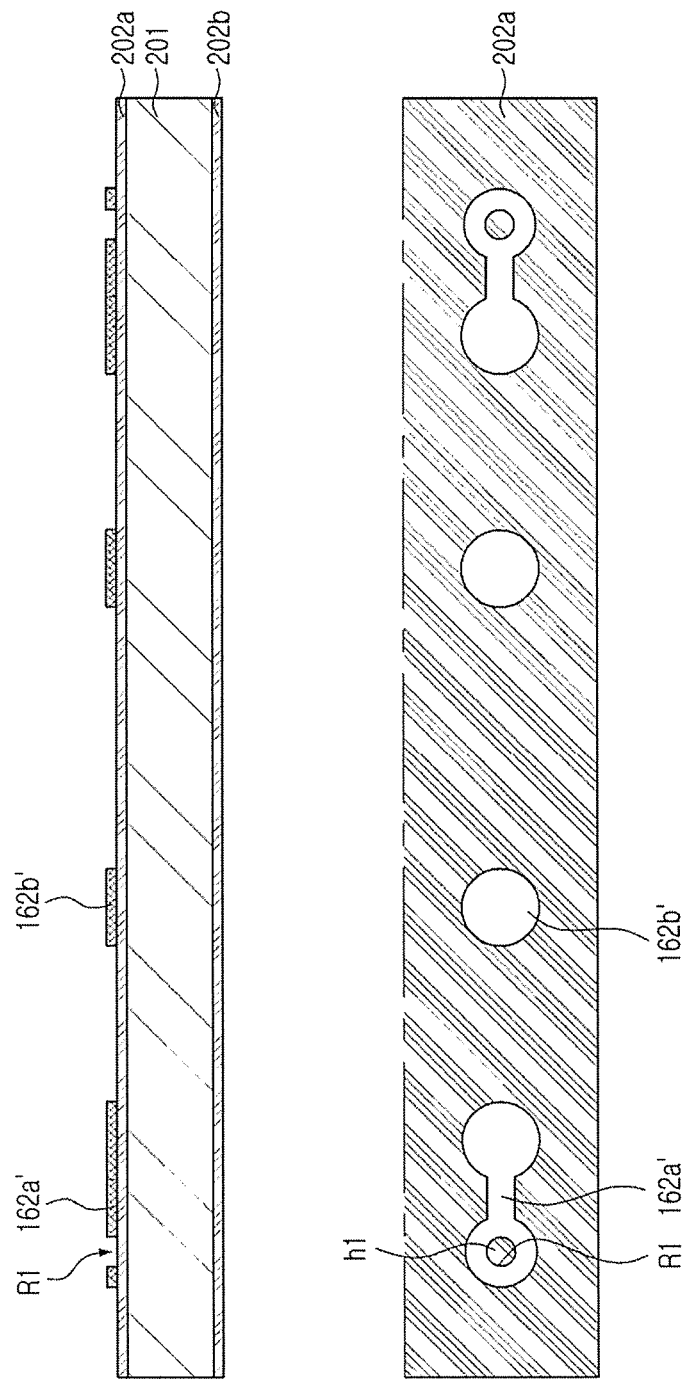
FIGS. 20A and 20B are cross-sectional views illustrating a process of forming a second redistribution layer of a method of manufacturing the fan-out semiconductor package illustrated in FIG. 19.
Figure 20B:
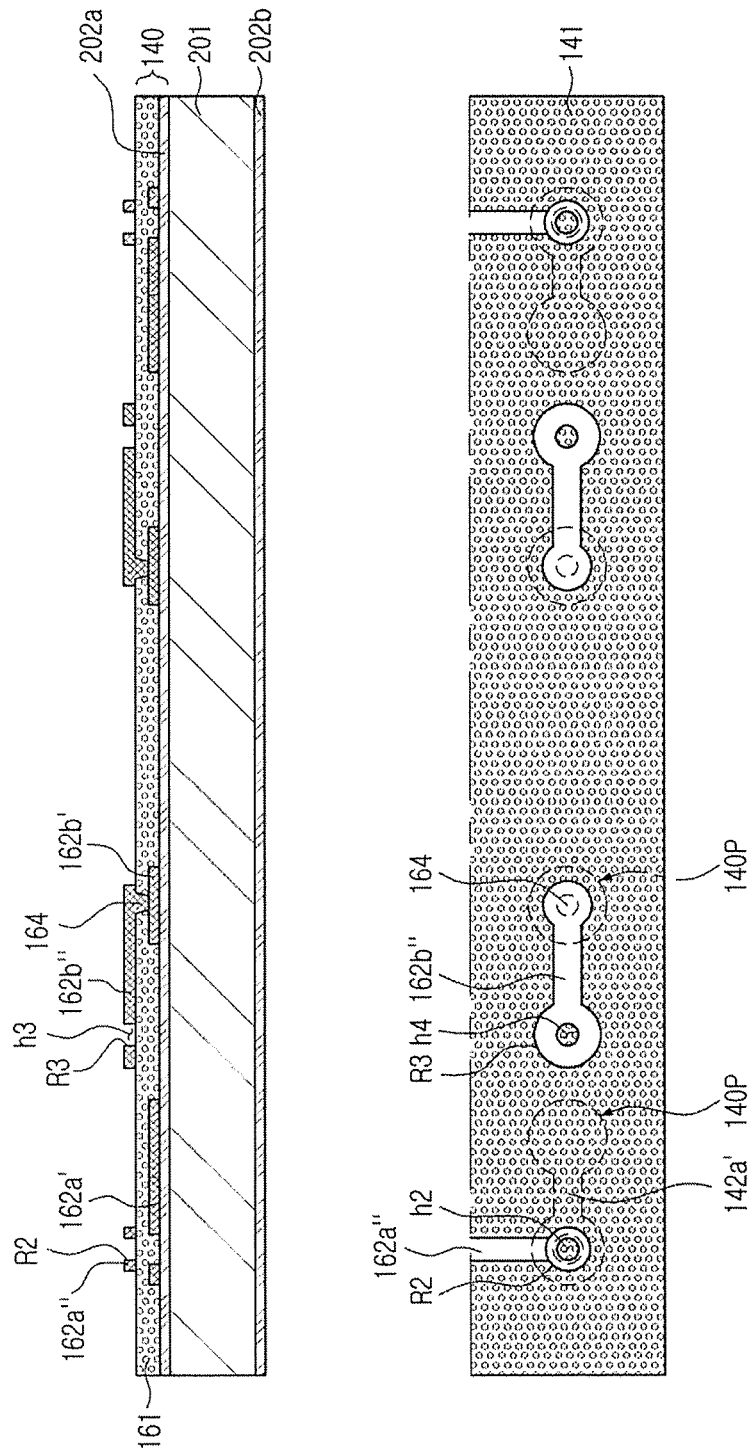

FIGS. 20A and 20B are cross-sectional views illustrating a process of forming a second redistribution layer of a method of manufacturing the fan-out semiconductor package illustrated in FIG. 19.

Referring to FIG. 20A, the first wiring patterns 162a' and 162b' may be formed on a temporary support 201.

The temporary support 201 may be a copper clad laminate having thin metal layers 202a and 202b, for example, copper foils, formed on upper and lower surfaces thereof, but is not limited thereto. A release layer may be formed on the copper foil or surface treatment may be performed on the copper foil so that the temporary support 201 is easily separated from the second redistribution layer in a subsequent process. The first wiring patterns 162a' and 162b' may be formed by a plating process using the copper foil as a seed layer, and may include, respectively, connection regions "R1" having holes "h1." The holes h1 may be formed to be disposed in regions of the wiring structure (particularly, the upper patterns), which is a connection target. The holes h1 refer to open regions in which conductors are not formed in order to easily form connection vias. The connection regions R1 of the first wiring patterns 162a' and 162b' have a relatively large width, and are illustrated in a ring shaped structure, but are not limited thereto.

Referring to FIG. 20B, the insulating layer 161 may be formed so that the first wiring patterns 162a' and 162b' are embedded therein, and the second wiring patterns 162a" and 162b" may be formed on the insulating layer 161.

The insulating layer 161 may be formed of the insulating material described above, for example, the photosensitive insulating material such as the PID. The second wiring patterns 162a" and 162b" may be formed by a plating process using the copper foil as a seed layer. Before the second wiring patterns are formed, holes may be formed in regions of the insulating layer 161 in which the interlayer vias 164 are to be formed, such that the interlayer vias 164 may be formed together with the second wiring patterns 162b". Similar to the first wiring patterns 162a' and 162b', the second wiring patterns 162a" and 162b" may include connection regions "R2" and "R3" having holes "h2" and "h3," respectively. In the present exemplary embodiment, the holes h2 of the second wiring patterns 162a" may be formed to overlap the holes h1 of the first wiring pattern 162a'.

FIGS. 21A through 21G are cross-sectional views illustrating the method of manufacturing the fan-out semiconductor package using the second redistribution layer provided in FIG. 20B.

Figure 21A:
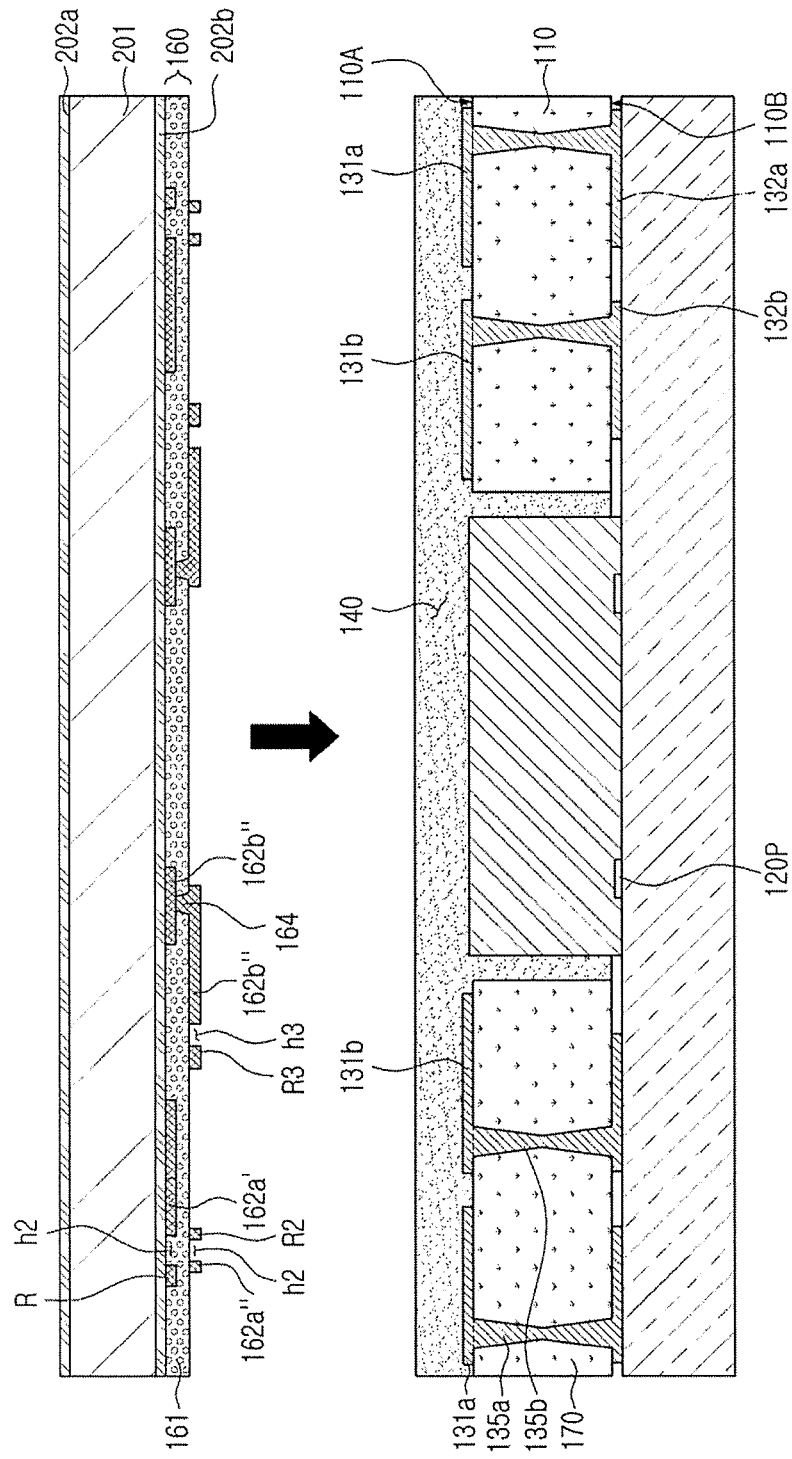
FIGS. 21A through 21G are cross-sectional views illustrating processes of a method of manufacturing the fan-out semiconductor package illustrated in FIG. 19.
Figure 21B:
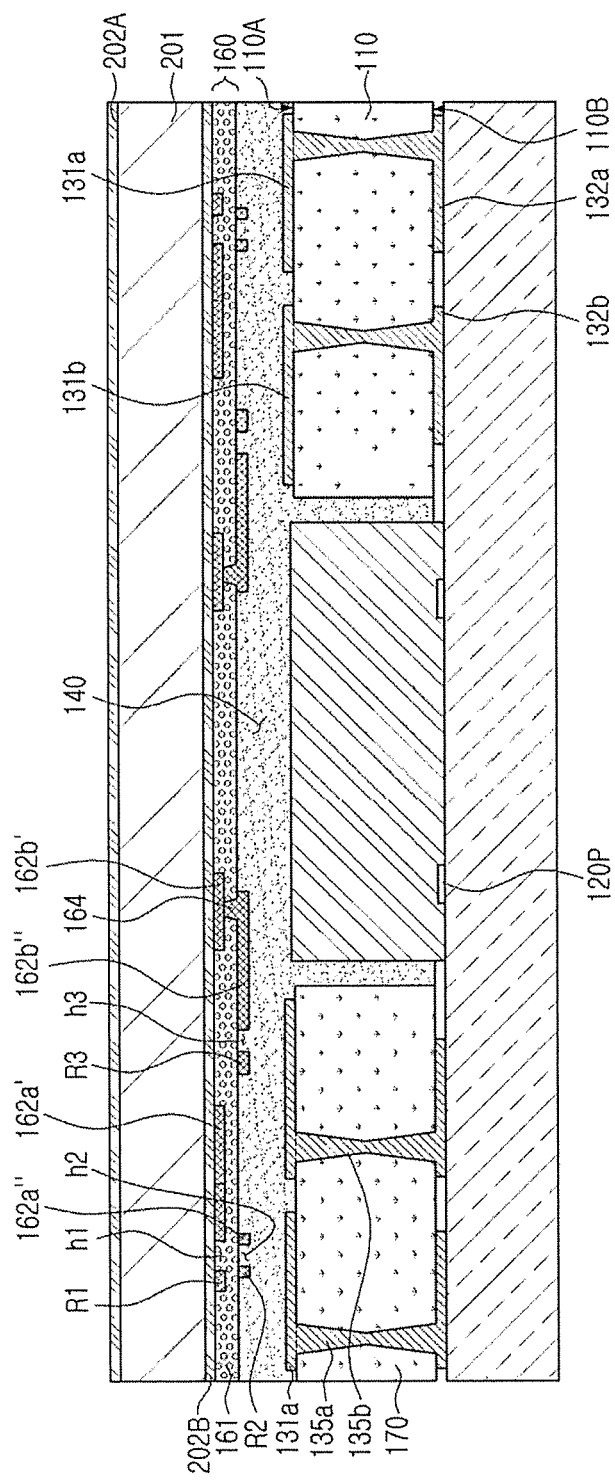

First, as illustrated in FIGS. 21A and 21B, the second redistribution layer 160' may be laminated on the surface of the encapsulant 140.

At the time of performing the present process, since the encapsulant 140 is in a non-hardened state, for example, a semi-hardened state, the second wiring patterns 162a" and 162b" may be convex as compared to the surface of the temporary support and may be embedded in the encapsulant 140 by a lamination process.

The second wiring patterns 162a" and 162b" embedded in the encapsulant 140 and the first wiring patterns 162a' and 162b' embedded in the insulating layer 161 may be disposed to partially overlap the upper patterns 131b of the wiring structure 130 to which they are to be connected. Particularly, the holes h1, h2, and h3 of the second wiring patterns 162a" and 162b" and the first wiring patterns 162a' may be disposed on regions of the upper patterns 131b to overlap the regions of the upper patterns 131b. After the second redistribution layer 160' is laminated on the encapsulant 140, a complete hardening process may be performed on the encapsulant.

Figure 21C:
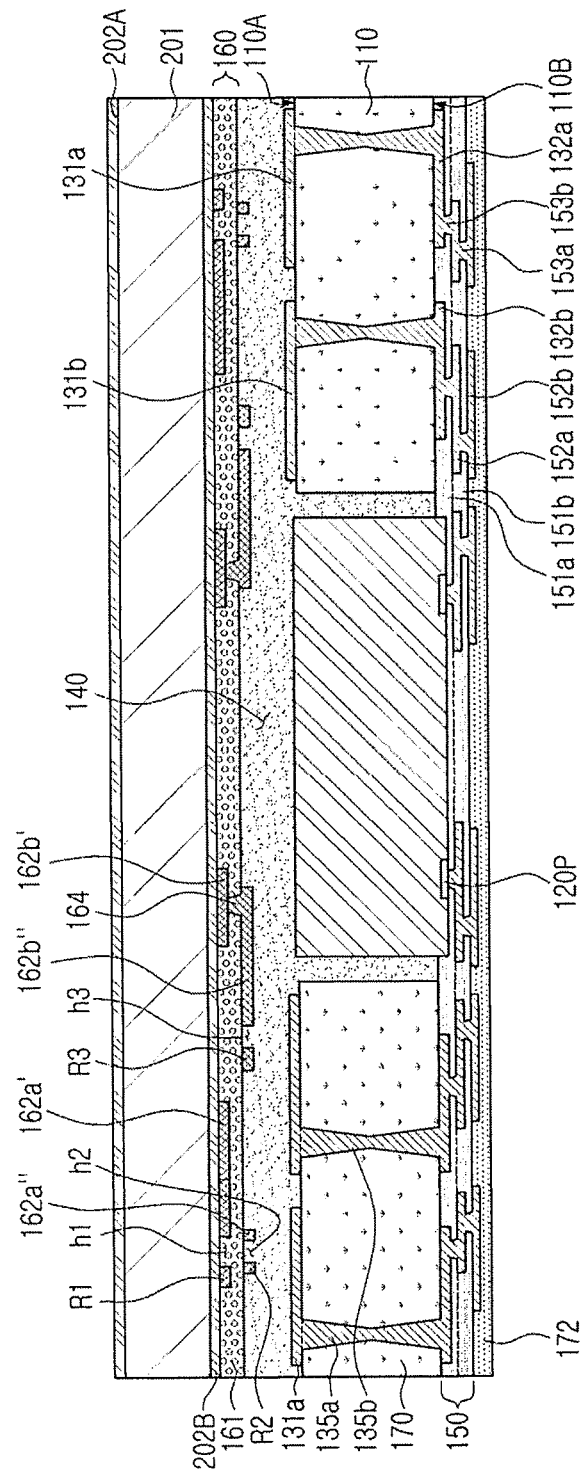

Referring to FIG. 21C, the connection member 150 having the first redistribution layer may be formed on lower surfaces of the supporting member 110 and the semiconductor chip 120, and the second passivation layer 172 disposed below the connection member 150 may be formed.

In the present exemplary embodiment, the first insulating layer 151a may be formed. Holes connected to the connection pads 120P of the semiconductor chip 120 and the first and second lower patterns 132a and 132b of the wiring structure 130 may be formed. The holes may be filled using a dry film to form the first vias 153a, and the first wiring patterns 152a may be formed on a desired surface of the first insulating layer 151a. Similarly, the second insulating layer 151b may be formed, and the second vias 153b and the second wiring patterns 152b may be formed to be connected to the first wiring patterns 152a. The first and second insulating layers 151a and 151b may be formed of a photosensitive insulating material such as PID, but are not limited thereto. The second passivation layer 172 may also be formed by a method of laminating a precursor of the second passivation layer 172 and then hardening the precursor, a method of applying a material for forming the second passivation layer 172 and then hardening the material, or the like.

Figure 21D:
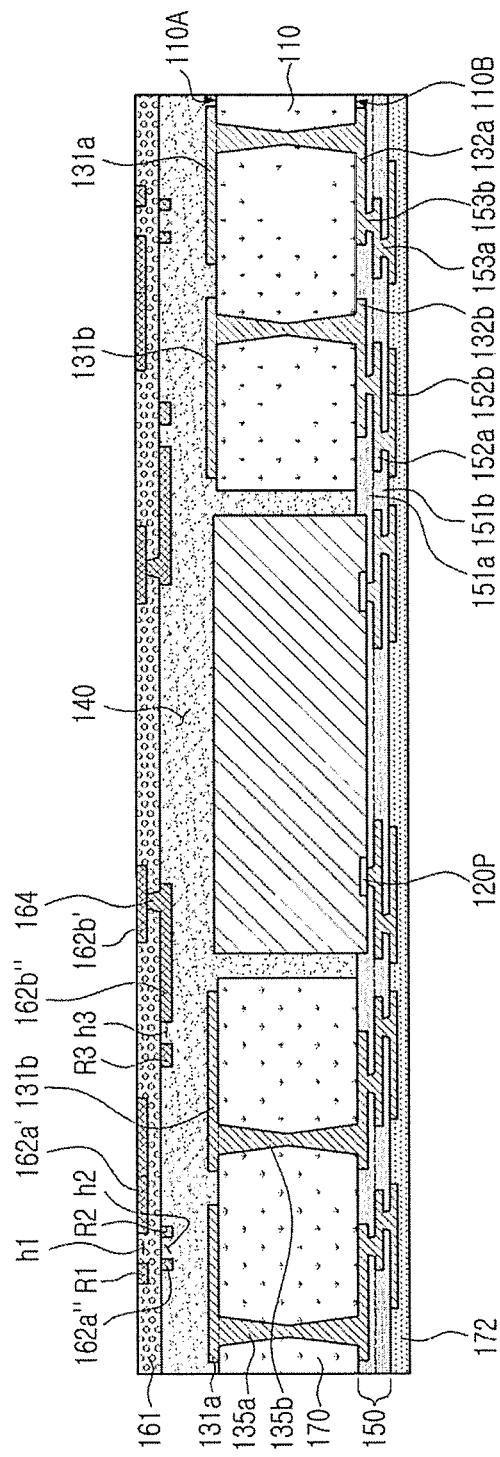

Referring to FIG. 21D, after the connection member 150 is formed, the temporary support 201 may be removed from the surface of the encapsulant 140.

The temporary support 201 may be removed so that the embedded wiring patterns 162 remain in the surface of the encapsulant 140. The temporary support 190 may be easily removed using a separating member such as the release layer described above, or the like. The process of removing the temporary support 190 may be easily performed after adhesion of the temporary support 190 is weakened using heat treatment, an ultraviolet ray, or the like, depending on characteristics of the temporary support or the release layer.

Figure 21E:
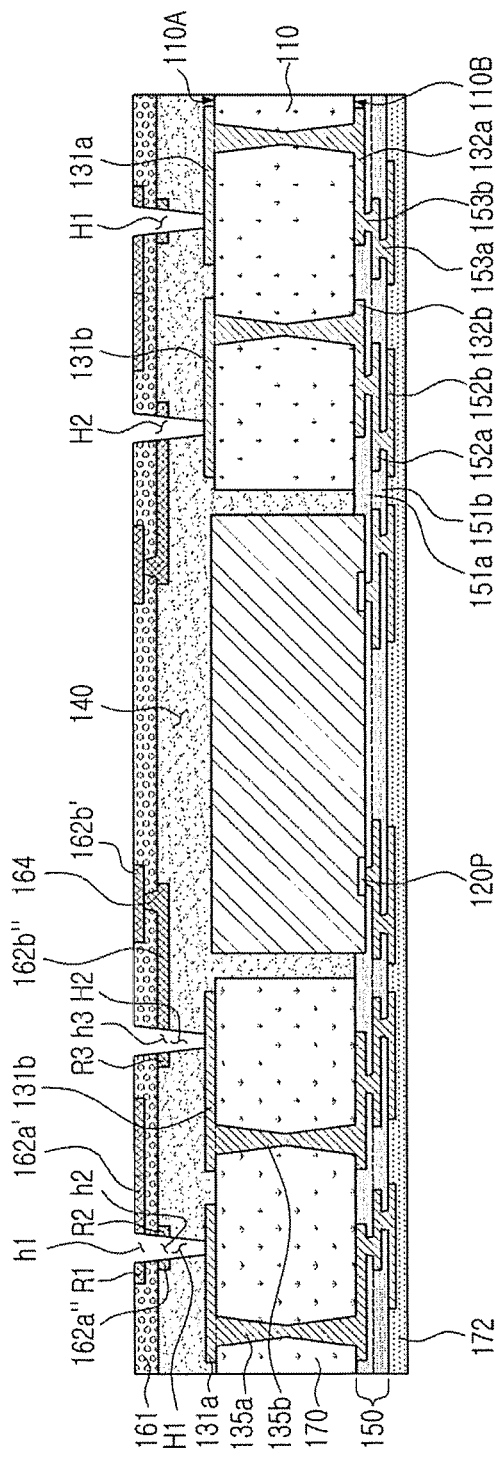

Referring to FIG. 21E, first and second via holes H1 and H2 connected to regions of the upper patterns 131a and 131b may be formed.

The first via holes H1 may connect the connection regions R1 of the first wiring patterns 162a' to regions of the upper patterns 131a through the connection regions R2 of the second wiring patterns 162a". The second via holes H2 may connect the connection regions R3 of the second wiring patterns 162b" to regions of the upper patterns 131b. The present process may be performed using a mechanical drill and/or a laser drill. A drill process may be easily performed since only regions of the encapsulant 140 are drilled due to the holes h1, h2, and h3 provided, respectively, in the connection regions R1, R2, and R3 in advance.

Figure 21F:
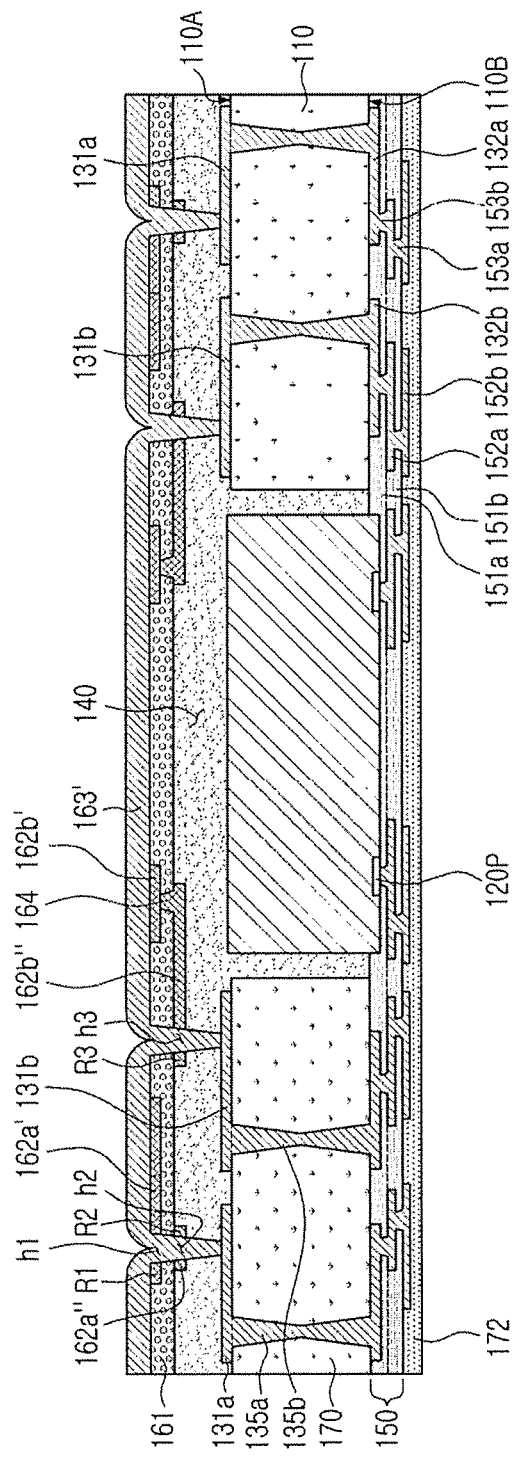

As illustrated in FIG. 21F, a plating layer 163' may be formed on the encapsulant 140 so that inner portions of the first and second via holes H1 and H2 are filled.

The plating layer 163' may be obtained by forming a seed layer on the surface of the encapsulant 140 as well as inner surfaces of the first and second via holes H1 and H2 and then performing a plating process on the seed layer. The plating layer 163' formed as described above may fill the inner portions of the first and second via holes H1 and H2.

Figure 21G:
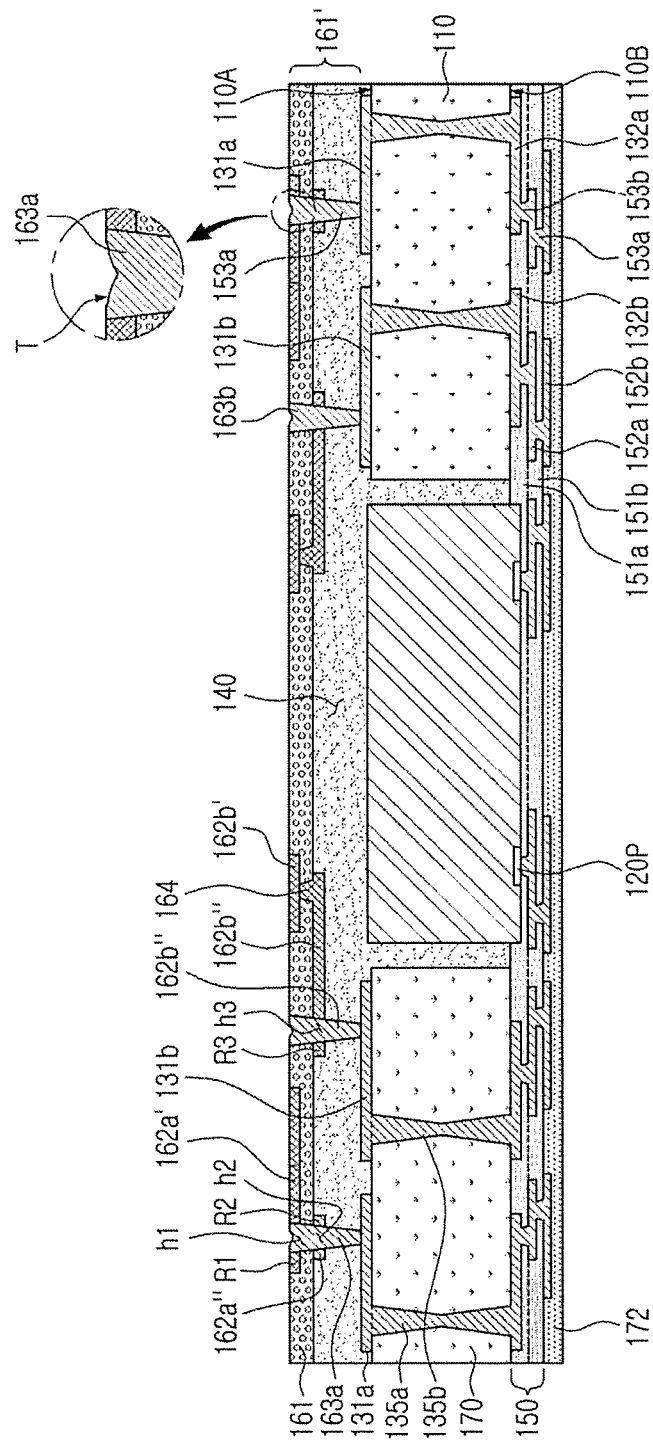

As illustrated in FIG. 21G, portions of the plating layer disposed on the encapsulant 140 may be removed so that the first and second connection vias 163a and 163b are formed.

Such a removing process may be performed by an etch back or grinding process. Portions of the plating layer remaining in the first and second via holes may be provided as the first and second connection vias 163a and 163b. The first connection vias 163a may penetrate through the encapsulant 140 and the insulating layer 161 to connect the connection regions of the first and second wiring patterns 162a' and 162a" and the upper patterns 131a to each other. The second connection vias 163b may connect the connection regions of the second wiring patterns 162b" and the upper patterns 131b to each other, and may penetrate through the encapsulant 140 and the insulating layer 161. Exposed surfaces of the first wiring patterns 162a' and 162b' of the second redistribution layer 160' may be substantially coplanar with the surface of the encapsulant 140. In addition, an upper surface "T" of the first connection via 163 may have a structure in which the central portion thereof is recessed. In some exemplary embodiments, a process of removing residuals from the surfaces of the embedded first wiring patterns 162a' and 162b' may be additionally performed.

The first passivation layer may be formed, similar to the second passivation layer described above. A plurality of first and second openings O1 and O2 may be formed in the first and second passivation layers 171 and 172, respectively, and the connection terminals 175 may be formed in the second openings O2 to manufacture the semiconductor package 100A illustrated in FIG. 19. Connection terminals may also be additionally formed in the first openings O1, if necessary.

As set forth above, according to the exemplary embodiments in the present disclosure, a desired redistribution structure may be formed on the surface of the encapsulant without performing a lithography process in a fan-out semiconductor package structure. A structure of two or more redistribution layers may also be implemented. The redistribution layer may be easily transferred in a rivet pin matching manner without using a separate matching equipment and in a vacuum lamination stacking manner.

While exemplary embodiments have been shown and described above, it will be apparent to those skilled in the art that modifications and variations could be made without departing from the scope of the present invention as defined by the appended claims.

What is claimed is:

1. A semiconductor package comprising:
a supporting member having a cavity and including a wiring structure connecting a first surface, and a second surface opposing the first surface;
a connection member on the second surface of the supporting member and including a first redistribution layer connected to the wiring structure;
a semiconductor chip on the connection member, in the cavity, and having connection pads connected to the first redistribution layer;
an encapsulant encapsulating the semiconductor chip in the cavity and covering the first surface of the supporting member; and
a second redistribution layer including wiring patterns embedded in the encapsulant, each of the wiring patterns having an exposed surface, and the wiring patterns including at least one wiring pattern having a connection via penetrating through the encapsulant to connect the wiring structure to the at least one wiring pattern,
wherein the at least one wiring pattern includes a connection portion through which the connection via passes, the connection portion having a width greater than a width of the at least one wiring pattern that is adjacent to and extends from the connection portion, and
wherein the connection portion has a hole, and the connection via penetrates through the hole.

2. The semiconductor package of claim 1, wherein the connection via has an upper surface of which a central portion is recessed.

3. The semiconductor package of claim 1, wherein a width of a first region of the connection via that connects to the at least one wiring pattern is greater than a width of a second region of the connection via that connects to with the wiring structure.

4. The semiconductor package of claim 1, wherein the exposed surface includes an upper surface substantially coplanar with a surface of the encapsulant.

5. The semiconductor package of claim 1, wherein the second redistribution layer further includes an insulating layer having a first surface and a second surface opposing each other, the second surface being in contact with the encapsulant, and
the wiring patterns include a first wiring pattern embedded in the first surface of the insulating layer and a second wiring pattern on the second surface of the insulating layer and embedded in the encapsulant.

6. The semiconductor package of claim 5, wherein the connection via includes a first connection via that penetrates through the insulating layer and the encapsulant to connect to the first wiring pattern and the second wiring pattern.

7. The semiconductor package of claim 5,
wherein the connection via includes a second connection via that penetrates through the insulating layer and the encapsulant to connect to the second wiring pattern and the wiring structure, and
wherein the second connection via is not in direct contact with the first wiring pattern.

8. The semiconductor package of claim 5, wherein the second redistribution layer includes an interlayer via that penetrates through the insulating layer and connect the first wiring pattern and the second wiring pattern to each other.

9. The semiconductor package of claim 8, wherein a width of a first portion of the interlayer via in contact with the second wiring pattern is greater than a width of a second portion of the interlayer via in contact with the first wiring pattern.

10. The semiconductor package of claim 9, wherein the interlayer via has a structure integrated with the second wiring pattern.

11. The semiconductor package of claim 1, wherein the second redistribution layer has a plurality of first pad regions, and
a first passivation layer having openings exposing the plurality of first pad regions is on a surface of the encapsulant.

12. A semiconductor package comprising:
a supporting member having a cavity and including a wiring structure connecting first and second surfaces opposing each other;
a connection member on the second surface of the supporting member and including a first redistribution layer connected to the wiring structure;
a semiconductor chip on the connection member, in the cavity, and having connection pads connected to the first redistribution layer;
an encapsulant encapsulating the semiconductor chip in the cavity and covering the first surface of the supporting member; and
a second redistribution layer including an insulating layer having a first surface and a second surface opposing each other, first wiring patterns embedded in the first surface of the insulating layer, second wiring patterns on the second surface of the insulating layer and embedded in the encapsulant, connection vias penetrating through the insulating layer and the encapsulant to connect the wiring structure and at least one of the first wiring patterns and the second wiring patterns to each other, the second surface of the insulating layer being in contact with the encapsulant.

13. A semiconductor package comprising:
a supporting member including a wiring structure connecting an upper surface of the supporting member to a lower surface of the supporting member;
a connection member on the lower surface of the supporting member and including a first redistribution layer connected to the wiring structure;
one or more components in a cavity of the supporting member;
an encapsulant covering the one or more components and the upper surface of the supporting member;
a second redistribution layer including an insulating layer having first and second surfaces opposing each other, the second surface being in contact with the encapsulant, and the second redistribution layer further including an electrode pad embedded in the first surface of the insulating layer and a wiring pattern on the second surface of the insulating layer and embedded in the encapsulant;
a first conductive via penetrating through a first portion of the wiring pattern, extending above the first portion of the wiring pattern, extending below the first portion of the wiring pattern into the encapsulant, and connected to the upper surface of the supporting member,
wherein the first redistribution layer is connected to the electrode pad of the second redistribution layer through the wiring structure of the supporting member, the first conductive via, and the wiring pattern of the second redistribution layer.

14. The semiconductor package of claim 13, further comprising:
a second conductive via penetrating through a second portion of the wiring pattern, extending below the second portion of the wiring pattern into the encapsulant, connected to the upper surface of the supporting member,
wherein an upper surface of the second conductive via is substantially coplanar with an upper surface of the second portion of the wiring pattern.

15. The semiconductor package of claim 14, wherein a central portion of the upper surface of the second conductive via is recessed.

16. The semiconductor package of claim 13, further comprising an interlayer via within the second redistribution layer and connecting a lower portion of the wiring pattern embedded in the encapsulant to an upper portion of the wiring pattern above the lower portion,
wherein an upper width of the interlayer via in contact with the upper portion of the wiring pattern is smaller than a lower width of the interlayer via in contact with the lower portion of the wiring pattern, and
wherein an upper width of the first conductive via above the first portion of the wiring pattern is larger than a lower width of the first conductive via below the first portion of the wiring pattern.

* * * * *